(12) United States Patent
Floyd et al.

(10) Patent No.: US 7,701,631 B2
(45) Date of Patent: Apr. 20, 2010

(54) DEVICE HAVING PATTERNED SPACERS FOR BACKPLATES AND METHOD OF MAKING THE SAME

(75) Inventors: Philip D. Floyd, Redwood City, CA (US); Brian W. Arbuckle, Danville, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 151 days.

(21) Appl. No.: 11/074,253

(22) Filed: Mar. 7, 2005

(65) Prior Publication Data

US 2006/0077145 A1   Apr. 13, 2006

Related U.S. Application Data

(60) Provisional application No. 60/613,478, filed on Sep. 27, 2004.

(51) Int. Cl.
*G02B 26/00* (2006.01)
(52) U.S. Cl. ..................... 359/290; 359/291
(58) Field of Classification Search ............... 359/290, 359/291, 223, 224, 318, 319, 237, 238
See application file for complete search history.

(56) References Cited

U.S. PATENT DOCUMENTS

| | | | |
|---|---|---|---|
| 2,534,846 A | 12/1950 | Ambrose et al. |
| 3,439,973 A | 4/1969 | Paul et al. |
| 3,443,854 A | 5/1969 | Weiss |
| 3,653,741 A | 4/1972 | Marks |
| 3,656,836 A | 4/1972 | de Cremoux et al. |
| 3,813,265 A | 5/1974 | Marks |
| 3,955,880 A | 5/1976 | Lierke |
| 4,036,360 A | 7/1977 | Deffeyes |
| 4,074,480 A | 2/1978 | Burton |
| 4,099,854 A | 7/1978 | Decker et al. |
| 4,228,437 A | 10/1980 | Shelton |
| 4,310,220 A | 1/1982 | Kuwagaki et al. |
| 4,377,324 A | 3/1983 | Durand et al. |
| 4,383,255 A | 5/1983 | Grandjean et al. |
| 4,389,096 A | 6/1983 | Hori et al. |
| 4,403,248 A | 9/1983 | te Velde |

(Continued)

FOREIGN PATENT DOCUMENTS

CN   1449990   10/2003

(Continued)

OTHER PUBLICATIONS

Liang, et al. "A Low Temperature Wafer-level hermetic MEMS package using UV curable adhesive" Electronic Components and Technology 2004, pp. 1486-1491.

(Continued)

*Primary Examiner*—Timothy J Thompson
(74) *Attorney, Agent, or Firm*—Knobbe, Martens, Olson & Bear, LLP

(57) ABSTRACT

Described herein are systems, devices, and methods relating to packaging electronic devices, for example, microelectromechanical systems (MEMS) devices, including optical modulators such as interferometric optical modulators. The packaging system disclosed herein comprises a patterned spacer that, in some embodiments, is fabricated using thin-film methods. In some embodiments, the spacer together with a substrate and backplate package an electronic device.

23 Claims, 12 Drawing Sheets

U.S. PATENT DOCUMENTS

| | | |
|---|---|---|
| 4,431,691 A | 2/1984 | Greenlee |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,954,789 A | 9/1990 | Sampsell |
| 4,956,619 A | 9/1990 | Hornbeck |
| 4,977,009 A | 12/1990 | Anderson et al. |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,244,707 A | 9/1993 | Shores |
| 5,254,980 A | 10/1993 | Hendrix et al. |
| 5,268,533 A | 12/1993 | Kovacs et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,296,950 A | 3/1994 | Lin et al. |
| 5,304,419 A | 4/1994 | Shores |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,325,116 A | 6/1994 | Sampsell |
| 5,327,286 A | 7/1994 | Sampsell et al. |
| 5,331,454 A | 7/1994 | Hornbeck |
| 5,339,116 A | 8/1994 | Urbanus et al. |
| 5,365,283 A | 11/1994 | Doherty et al. |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,489,952 A | 2/1996 | Gove et al. |
| 5,497,172 A | 3/1996 | Doherty et al. |
| 5,497,197 A | 3/1996 | Gove et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,591,379 A | 1/1997 | Shores |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoades et al. |
| 5,619,366 A | 4/1997 | Rhoads et al. |
| 5,636,052 A | 6/1997 | Arney et al. |
| 5,646,768 A | 7/1997 | Kaeiyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,665,997 A | 9/1997 | Weaver et al. |
| 5,703,710 A | 12/1997 | Brinkman et al. |
| 5,710,656 A | 1/1998 | Goosen |
| 5,717,476 A | 2/1998 | Kanezawa |
| 5,739,945 A | 4/1998 | Tayebati |
| 5,745,193 A | 4/1998 | Urbanus et al. |
| 5,745,281 A | 4/1998 | Yi et al. |
| 5,771,116 A | 6/1998 | Miller et al. |
| 5,771,321 A | 6/1998 | Stern |
| 5,784,189 A | 7/1998 | Bozler et al. |
| 5,784,190 A | 7/1998 | Worley |
| 5,784,212 A | 7/1998 | Hornbeck |
| 5,815,141 A | 9/1998 | Phares |
| 5,818,095 A | 10/1998 | Sampsell |
| 5,825,528 A | 10/1998 | Goosen |

| | | | |
|---|---|---|---|
| 5,835,255 A | 11/1998 | Miles | |
| 5,837,562 A | 11/1998 | Cho | |
| 5,842,088 A | 11/1998 | Thompson | |
| 5,853,662 A | 12/1998 | Watanabe | |
| 5,856,820 A | 1/1999 | Weigers et al. | |
| 5,912,758 A | 6/1999 | Knipe et al. | |
| 5,936,758 A | 8/1999 | Fisher et al. | |
| 5,939,785 A | 8/1999 | Klonis et al. | |
| 5,959,763 A * | 9/1999 | Bozler et al. | 359/290 |
| 5,986,796 A | 11/1999 | Miles | |
| 5,999,306 A | 12/1999 | Atobe et al. | |
| 6,028,690 A | 2/2000 | Carter et al. | |
| 6,038,056 A | 3/2000 | Florence et al. | |
| 6,040,937 A | 3/2000 | Miles | |
| 6,049,317 A | 4/2000 | Thompson et al. | |
| 6,055,090 A | 4/2000 | Miles et al. | |
| 6,061,075 A | 5/2000 | Nelson et al. | |
| 6,099,132 A | 8/2000 | Kaeriyama | |
| 6,107,115 A * | 8/2000 | Atobe et al. | 438/72 |
| 6,113,239 A | 9/2000 | Sampsell et al. | |
| 6,120,339 A | 9/2000 | Alwan | |
| 6,127,765 A | 10/2000 | Fushinobu | |
| 6,147,790 A | 11/2000 | Meier et al. | |
| 6,160,833 A | 12/2000 | Floyd et al. | |
| 6,180,428 B1 | 1/2001 | Peeters et al. | |
| 6,195,196 B1 | 2/2001 | Kimura et al. | |
| 6,201,633 B1 | 3/2001 | Peeters et al. | |
| 6,232,936 B1 | 5/2001 | Gove et al. | |
| 6,238,755 B1 | 5/2001 | Harvey et al. | |
| 6,282,010 B1 | 8/2001 | Sulzbach et al. | |
| 6,295,154 B1 | 9/2001 | Laor et al. | |
| 6,303,986 B1 | 10/2001 | Shook | |
| 6,323,982 B1 | 11/2001 | Hornbeck | |
| 6,365,229 B1 | 4/2002 | Robbins | |
| 6,379,988 B1 | 4/2002 | Peterson et al. | |
| 6,426,124 B2 | 7/2002 | Olster et al. | |
| 6,426,461 B1 | 7/2002 | Ginter et al. | |
| 6,447,126 B1 | 9/2002 | Hornbeck | |
| 6,455,927 B1 | 9/2002 | Glenn et al. | |
| 6,462,392 B1 | 10/2002 | Pinter et al. | |
| 6,465,355 B1 | 10/2002 | Horsley | |
| 6,466,354 B1 | 10/2002 | Gudeman | |
| 6,466,358 B2 | 10/2002 | Tew | |
| 6,472,739 B1 | 10/2002 | Wood et al. | |
| 6,473,274 B1 | 10/2002 | Maimone et al. | |
| 6,480,177 B2 | 11/2002 | Doherty et al. | |
| 6,489,670 B1 | 12/2002 | Peterson et al. | |
| 6,495,895 B1 | 12/2002 | Peterson et al. | |
| 6,496,122 B2 | 12/2002 | Sampsell | |
| 6,507,385 B1 | 1/2003 | Nishiyama et al. | |
| 6,525,416 B2 | 2/2003 | Hauser et al. | |
| 6,538,312 B1 | 3/2003 | Peterson et al. | |
| 6,545,335 B1 | 4/2003 | Chua et al. | |
| 6,548,908 B2 | 4/2003 | Chua et al. | |
| 6,549,338 B1 | 4/2003 | Wolverton et al. | |
| 6,552,840 B2 | 4/2003 | Knipe | |
| 6,558,820 B2 | 5/2003 | Raychaudhuri et al. | |
| 6,574,033 B1 | 6/2003 | Chui et al. | |
| 6,583,921 B2 | 6/2003 | Nelson | |
| 6,589,625 B1 | 7/2003 | Kothari et al. | |
| 6,600,201 B2 | 7/2003 | Hartwell et al. | |
| 6,603,182 B1 | 8/2003 | Low et al. | |
| 6,606,175 B1 | 8/2003 | Sampsell et al. | |
| 6,625,047 B2 | 9/2003 | Coleman, Jr. | |
| 6,630,786 B2 | 10/2003 | Cummings et al. | |
| 6,632,698 B2 | 10/2003 | Ives | |
| 6,643,069 B2 | 11/2003 | Dewald | |
| 6,650,455 B2 | 11/2003 | Miles | |
| 6,661,084 B1 | 12/2003 | Peterson et al. | |
| 6,666,561 B1 | 12/2003 | Blakley | |
| 6,674,159 B1 | 1/2004 | Peterson et al. | |
| 6,674,562 B1 | 1/2004 | Miles | |
| 6,680,792 B2 | 1/2004 | Miles | |
| 6,690,444 B1 | 2/2004 | Wilkinson et al. | |
| 6,710,908 B2 | 3/2004 | Miles et al. | |
| 6,741,377 B2 | 5/2004 | Miles | |
| 6,741,384 B1 | 5/2004 | Martin et al. | |
| 6,741,503 B1 | 5/2004 | Farris et al. | |
| 6,747,785 B2 | 6/2004 | Chen et al. | |
| 6,775,174 B2 | 8/2004 | Huffman et al. | |
| 6,778,046 B2 | 8/2004 | Stafford et al. | |
| 6,778,155 B2 | 8/2004 | Doherty et al. | |
| 6,779,260 B1 | 8/2004 | Brandenburg et al. | |
| 6,794,119 B2 | 9/2004 | Miles | |
| 6,811,267 B1 | 11/2004 | Allen et al. | |
| 6,819,469 B1 | 11/2004 | Koba | |
| 6,822,628 B2 | 11/2004 | Dunphy et al. | |
| 6,829,132 B2 | 12/2004 | Martin et al. | |
| 6,833,668 B1 | 12/2004 | Yamada et al. | |
| 6,843,936 B1 * | 1/2005 | Jacobs | 252/194 |
| 6,853,129 B1 | 2/2005 | Cummings et al. | |
| 6,855,610 B2 | 2/2005 | Tung et al. | |
| 6,859,218 B1 | 2/2005 | Luman et al. | |
| 6,861,277 B1 | 3/2005 | Monroe et al. | |
| 6,862,022 B2 | 3/2005 | Slupe | |
| 6,862,029 B1 | 3/2005 | D'Souza et al. | |
| 6,867,896 B2 | 3/2005 | Miles | |
| 6,870,581 B2 | 3/2005 | Li et al. | |
| 6,882,458 B2 | 4/2005 | Lin et al. | |
| 6,882,480 B2 * | 4/2005 | Yanagisawa | 359/634 |
| 6,914,245 B2 | 7/2005 | Sone et al. | |
| 6,947,200 B2 * | 9/2005 | Huibers | 359/291 |
| 6,995,890 B2 | 2/2006 | Lin | |
| 6,999,225 B2 * | 2/2006 | Lin et al. | 359/290 |
| 7,015,885 B2 | 3/2006 | Novotny et al. | |
| 7,019,458 B2 | 3/2006 | Yoneda | |
| 7,034,984 B2 * | 4/2006 | Pan et al. | 359/291 |
| 7,046,374 B1 | 5/2006 | Barbarossa | |
| 7,060,895 B2 | 6/2006 | Kothari et al. | |
| 7,123,216 B2 | 10/2006 | Miles | |
| 7,126,741 B2 | 10/2006 | Wagner et al. | |
| 7,161,728 B2 | 1/2007 | Sampsell et al. | |
| 7,164,520 B2 | 1/2007 | Palmateer et al. | |
| 7,218,438 B2 | 5/2007 | Przybyla et al. | |
| 7,456,497 B2 | 11/2008 | Higashi | |
| 7,517,712 B2 * | 4/2009 | Stark | 438/51 |
| 2001/0003487 A1 | 6/2001 | Miles | |
| 2001/0004085 A1 | 6/2001 | Gueissaz | |
| 2001/0055146 A1 | 12/2001 | Atobe et al. | |
| 2002/0012364 A1 | 1/2002 | Kalian et al. | |
| 2002/0015215 A1 | 2/2002 | Miles | |
| 2002/0043706 A1 | 4/2002 | Jerominek et al. | |
| 2002/0052392 A1 | 5/2002 | Day et al. | |
| 2002/0056898 A1 | 5/2002 | Lopes et al. | |
| 2002/0056900 A1 | 5/2002 | Liu et al. | |
| 2002/0057565 A1 | 5/2002 | Seo | |
| 2002/0070931 A1 | 6/2002 | Ishikawa | |
| 2002/0075551 A1 | 6/2002 | Daneman et al. | |
| 2002/0075555 A1 | 6/2002 | Miles | |
| 2002/0126364 A1 | 9/2002 | Miles | |
| 2002/0160583 A1 | 10/2002 | Song | |
| 2002/0187254 A1 | 12/2002 | Ghosh | |
| 2003/0043157 A1 | 3/2003 | Miles | |
| 2003/0054588 A1 | 3/2003 | Patel et al. | |
| 2003/0062186 A1 | 4/2003 | Boroson et al. | |
| 2003/0072070 A1 | 4/2003 | Miles | |
| 2003/0075794 A1 | 4/2003 | Felton et al. | |
| 2003/0108306 A1 | 6/2003 | Whitney et al. | |
| 2003/0111603 A1 | 6/2003 | Sone et al. | |
| 2003/0144034 A1 | 7/2003 | Hack et al. | |
| 2003/0152872 A1 | 8/2003 | Miles | |
| 2003/0161126 A1 | 8/2003 | Wilkinson et al. | |
| 2003/0183916 A1 | 10/2003 | Heck et al. | |
| 2003/0184412 A1 | 10/2003 | Gorrell | |
| 2003/0202264 A1 | 10/2003 | Weber et al. | |
| 2003/0202265 A1 | 10/2003 | Reboa et al. | |

| | | | | | |
|---|---|---|---|---|---|
| 2003/0202266 A1 | 10/2003 | Ring et al. | JP | 2001-318324 | 11/2001 |
| 2004/0051929 A1 | 3/2004 | Sampsell et al. | JP | 2001-351998 | 12/2001 |
| 2004/0058532 A1 | 3/2004 | Miles et al. | JP | 2002-062491 | 2/2002 |
| 2004/0061492 A1 | 4/2004 | Lopes et al. | JP | 2002-062492 | 2/2002 |
| 2004/0076008 A1 | 4/2004 | Ikeda | JP | 2002-258310 | 9/2002 |
| 2004/0080807 A1 | 4/2004 | Chen et al. | JP | 2002-296519 | 10/2002 |
| 2004/0100677 A1 | 5/2004 | Huibers et al. | JP | 2002-312066 | 10/2002 |
| 2004/0140557 A1 | 7/2004 | Sun et al. | JP | 2002-328313 | 11/2002 |
| 2004/0145049 A1 | 7/2004 | McKinnell et al. | JP | 2002-357846 | 12/2002 |
| 2004/0147056 A1 | 7/2004 | McKinnell et al. | JP | 2003-075741 | 3/2003 |
| 2004/0150319 A1 | 8/2004 | Tomimatsu et al. | JP | 2003-233024 | 8/2003 |
| 2004/0160143 A1 | 8/2004 | Shreeve et al. | JP | 2003-330001 | 11/2003 |
| 2004/0163472 A1 | 8/2004 | Nagahara | JP | 2004-053852 | 2/2004 |
| 2004/0173886 A1 | 9/2004 | Carley | JP | 2004-78107 | 3/2004 |
| 2004/0174583 A1 | 9/2004 | Chen et al. | JP | 2004-118001 | 4/2004 |
| 2004/0179281 A1 | 9/2004 | Reboa | WO | WO 90/05795 | 5/1990 |
| 2004/0183990 A1* | 9/2004 | Guang et al. ............... 349/155 | WO | WO 95/01624 | 1/1995 |
| 2004/0184133 A1 | 9/2004 | Su et al. | WO | WO 95/30924 | 11/1995 |
| 2004/0191937 A1 | 9/2004 | Patel et al. | WO | WO9530924 | 11/1995 |
| 2004/0212026 A1 | 10/2004 | Van Brocklin et al. | WO | WO9717628 | 5/1997 |
| 2004/0217378 A1 | 11/2004 | Martin et al. | WO | WO 98/06118 | 2/1998 |
| 2004/0217919 A1 | 11/2004 | Pichl et al. | WO | WO 99/41732 | 8/1999 |
| 2004/0218251 A1 | 11/2004 | Piehl et al. | WO | WO9952006 A2 | 10/1999 |
| 2004/0218334 A1 | 11/2004 | Martin et al. | WO | WO9952006 A3 | 10/1999 |
| 2004/0218341 A1 | 11/2004 | Martin et al. | WO | WO 00/16105 | 3/2000 |
| 2004/0227493 A1 | 11/2004 | Van Brocklin et al. | WO | WO 00/17695 | 3/2000 |
| 2004/0240032 A1 | 12/2004 | Miles | WO | WO 01/45140 | 6/2001 |
| 2004/0240138 A1 | 12/2004 | Martin et al. | WO | WO 01/58804 | 8/2001 |
| 2004/0245588 A1 | 12/2004 | Nikkel et al. | WO | WO 02/42716 | 5/2002 |
| 2004/0263944 A1 | 12/2004 | Miles et al. | WO | WO03007049 A1 | 1/2003 |
| 2005/0001828 A1 | 1/2005 | Martin et al. | WO | WO 03/023849 | 3/2003 |
| 2005/0002079 A1 | 1/2005 | Novotny et al. | WO | WO 03/026369 A1 | 3/2003 |
| 2005/0020089 A1 | 1/2005 | Shi et al. | WO | WO 03/054925 | 3/2003 |
| 2005/0035699 A1 | 2/2005 | Tsai | WO | WO 03/070625 | 8/2003 |
| 2005/0036095 A1 | 2/2005 | Yeh et al. | WO | WO03069413 A1 | 8/2003 |
| 2005/0036192 A1 | 2/2005 | Lin et al. | WO | WO03073151 A1 | 9/2003 |
| 2005/0038950 A1 | 2/2005 | Adelmann | WO | WO 03/084861 | 10/2003 |
| 2005/0042117 A1 | 2/2005 | Lin | WO | WO 03/095706 | 11/2003 |
| 2005/0046919 A1 | 3/2005 | Taguchi et al. | WO | WO 03/105198 | 12/2003 |
| 2005/0057442 A1 | 3/2005 | Way | WO | WO2004006003 A1 | 1/2004 |
| 2005/0068583 A1 | 3/2005 | Gutkowski et al. | WO | WO2004026757 A2 | 4/2004 |
| 2005/0069209 A1 | 3/2005 | Damera-Venkata et al. | WO | WO 04/077523 | 9/2004 |
| 2005/0074919 A1 | 4/2005 | Patel | WO | WO 2005/066596 | 7/2005 |
| 2005/0093134 A1 | 5/2005 | Tarn | WO | WO 2005/110914 | 11/2005 |
| 2005/0167795 A1 | 8/2005 | Higashi | WO | WO 2005/110914 A1 | 11/2005 |
| 2005/0184304 A1 | 8/2005 | Gupta et al. | WO | WO 2005/114294 | 11/2005 |
| 2005/0195462 A1 | 9/2005 | Lin | WO | WO 2005/114294 A1 | 12/2005 |
| 2005/0253283 A1 | 11/2005 | Dcamp et al. | | | |
| 2005/0254982 A1 | 11/2005 | Cadeddu | | | |
| 2006/0029732 A1 | 2/2006 | Kobrin et al. | | | |
| 2006/0066935 A1 | 3/2006 | Cummings et al. | | | |
| 2006/0148365 A1 | 7/2006 | Tsai | | | |
| 2006/0214569 A1* | 9/2006 | Ohshita et al. ............... 313/504 | | | |
| 2006/0274400 A1 | 12/2006 | Miles | | | |
| 2007/0170568 A1 | 7/2007 | Chui et al. | | | |
| 2009/0103167 A1 | 4/2009 | Tsai | | | |
| 2009/0219605 A1 | 9/2009 | Lin et al. | | | |

FOREIGN PATENT DOCUMENTS

| | | |
|---|---|---|
| EP | 0 667 548 | 8/1995 |
| EP | 0 695 959 | 2/1996 |
| EP | 0 822 570 | 2/1998 |
| EP | 1418154 A2 | 5/2004 |
| EP | 1 433 742 | 6/2004 |
| FR | 2841380 | 12/2003 |
| JP | 61-206244 | 9/1986 |
| JP | 63-162378 | 10/1988 |
| JP | 02-068513 | 3/1990 |
| JP | 03-199920 | 8/1991 |
| JP | 08-162006 | 6/1996 |
| JP | 10-70287 | 3/1998 |
| JP | 11 337953 | 12/1999 |

OTHER PUBLICATIONS

Moraja, et al. Advanced Getter Solutions at Wafer Level to Assure High Reliability to the last Generations MEMS, IEEE Reliability Physics Symposium Proceedings, 2003 pp. 458-459.

EP Search Report for EP patent application No. 05255700.6-2217.

EP Search Report for EP patent application No. 05255684.2-2217.

Liang, Zhi-Hao et al., "A Low Temperature Wafer-Level Hermetic MEMS Package Using UV Curable Adhesive", Electronic Components and Technology Conference, 2004 IEEE, pp. 1486-1491.

EP Search Report dated Dec. 21, 2005 for EP Patent No. 05255700. 6-2217.

Akasaka, "Three-Dimensional IC Trends", Proceedings of IEEE, vol. 74, No. 12, pp. 1703-1714, (Dec. 1986).

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K., et al., "Surface micromachined tuneable interferometer array," Sensors and Actuators, pp. 17-23. (1994).

Conner, "Hybrid Color Display Using Optical Interference Filter Array," SID Digest, pp. 577-580 (1993).

Goossen et al., "Possible Display Applications of the Silicon Mechanical Anti-Reflection Switch," Society for Information Dispaly (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).

Gosch, "West Germany Grabs the Lead in X-Ray Lithography," Electronics pp. 78-80 (Feb. 5, 1987).

Howard et al., "Nanometer-Scale Fabrication Techniques", VLSI Electronics: Microstructure Science, vol. 5, pp. 145-153 and pp. 166-173 (1982).

Jackson "Classical Electrodynamics", John Wiley & Sons Inc., pp. 568-573. (date unknown).

Jerman et al., "A Miniature Fabry-Perot Interferometer with a Corrugated Silicon Diaphragm Support", (1988).

Johnson "Optical Scanners", Microwave Scanning Antennas, vol. 1, p. 251-261, (1964).

Light over Matter, Circle No. 36 (Jun. 1993).

Miles, Mark, W., "A New Reflective FPD Technology Using Interferometric Modulation", The Proceedings of the Society for Information Display (May 11-16, 1997).

Newsbreaks, "Quantum-trench devices might operate at terahertz frequencies", Laser Focus World (May 1993).

Oliner et al., "Radiating Elements and Mutual Coupling", Microwave Scanning Antennas, vol. 2, pp. 131-141, (1966).

Raley et al., "A Fabry-Perot Microinterferometer for Visible Wavelengths", IEEE Solid-State Sensor and Actuator Workshop, Jun. 1992, Hilton Head, SC.

Sperger et al., "High Performance Patterned All-Dielectric Interference Colour Filter for Display Applications", SID Digest, pp. 81-83, (1994).

Stone, "Radiation and Optics, An Introduction to the Classical Theory", McGraw-Hill, pp. 340-343, (1963).

Walker, et al., "Electron-beam-tunable Interference Filter Spatial Light Modulator", Optics Letters vol. 13, No. 5, pp. 345-347, (May 1988).

Winton, John M., "A novel way to capture solar energy", Chemical Week, (May 1985).

Wu, "Design of a Reflective Color LCD Using Optical Interference Reflectors", ASIA Display '95, pp. 929-931, (Oct. 1995).

Greco et al., Optical properties of IPN-like networks polyethylene/poly(butylmethacrylate-co-styrene copolymer systems, III. Influence of copolymer crosslinkers, Polymer 42 (2001), 5089-5095.

Sparks, et al. Chip-Level Vacuum Packaging of Micromachines Using NanoGetters, IEEE Transactions on Advanced Packaging, vol. 26 Issue 3, Aug. 2003, pp. 277-282.

Miles, MEMS-based interferometric modulator for display applications, Proceedings of the SPIE, Micromachined Devices and Components V, Sep. 1999, pp. 20-28.

Stark et al., An integrated process for post-packaging release and vacuum sealing of electroplated nickel packages, Transducers, 12th International Conference on Solid-State Sensors, Actuators and Microsystems, 2003, pp. 1911-1914.

Official Communication for European App. No. 05255700.6, dated Apr. 17, 2008.

Tilmans et al., The indent reflow sealing (IRS) technique-A method for the fabrication of sealed cavities for mems devices, Journal of Microelectromechanical Systems, 9(2), Jun. 2000.

Official Communication for European App. No. 05255700.6, dated Apr. 17, 2008.

Office Action received Jun. 13, 2008 in Chinese App. No. 2005101050371.

Notice of Reasons for Rejection dated Aug. 26, 2008 in Japanese App. No. 2005-253640.

* cited by examiner

|  | Column Output Signals | |
|---|---|---|
|  | $+V_{bias}$ | $-V_{bias}$ |
| 0 | Stable | Stable |
| $+\Delta V$ | Release | Actuate |
| $-\Delta V$ | Actuate | Release |

Row Output Signals

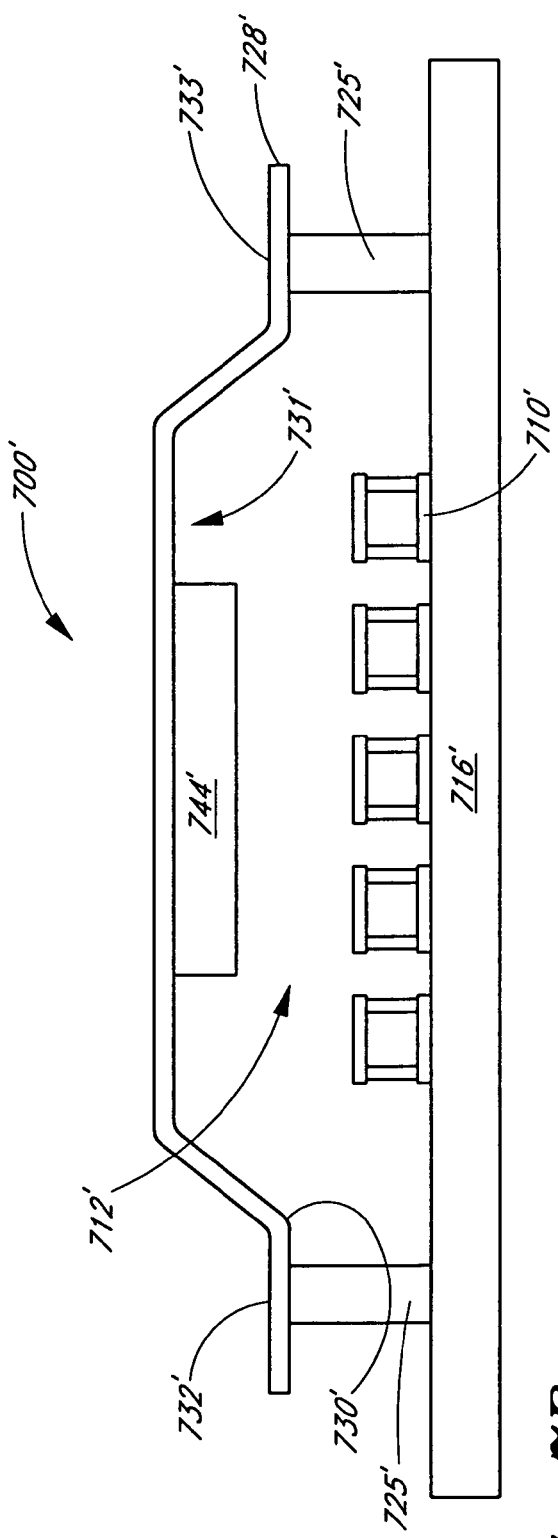
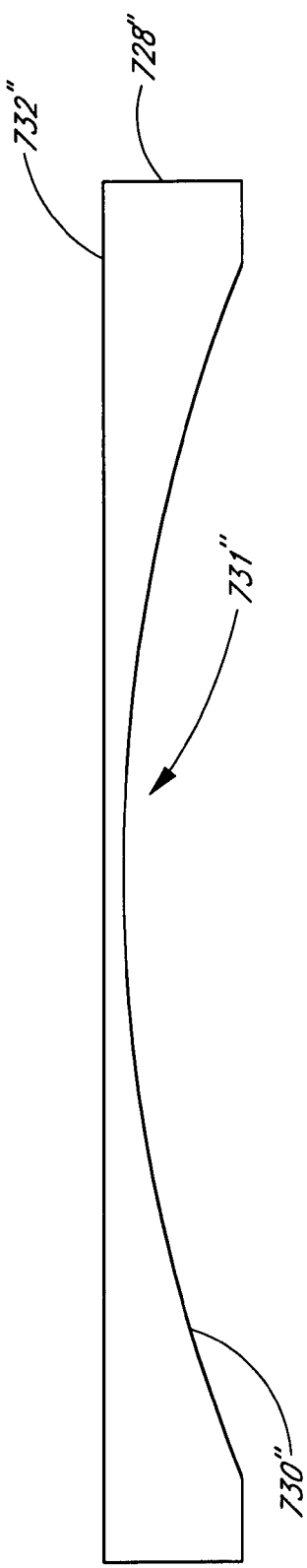
FIG. 7B
FIG. 7C

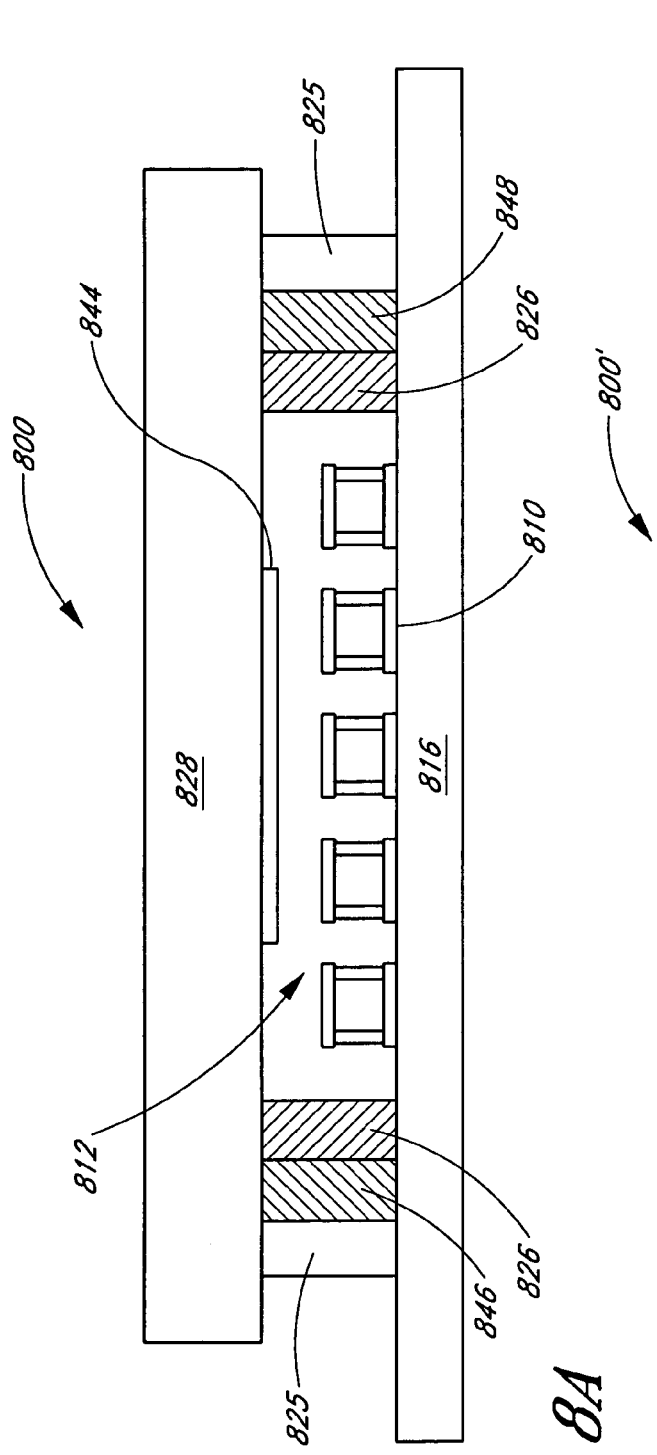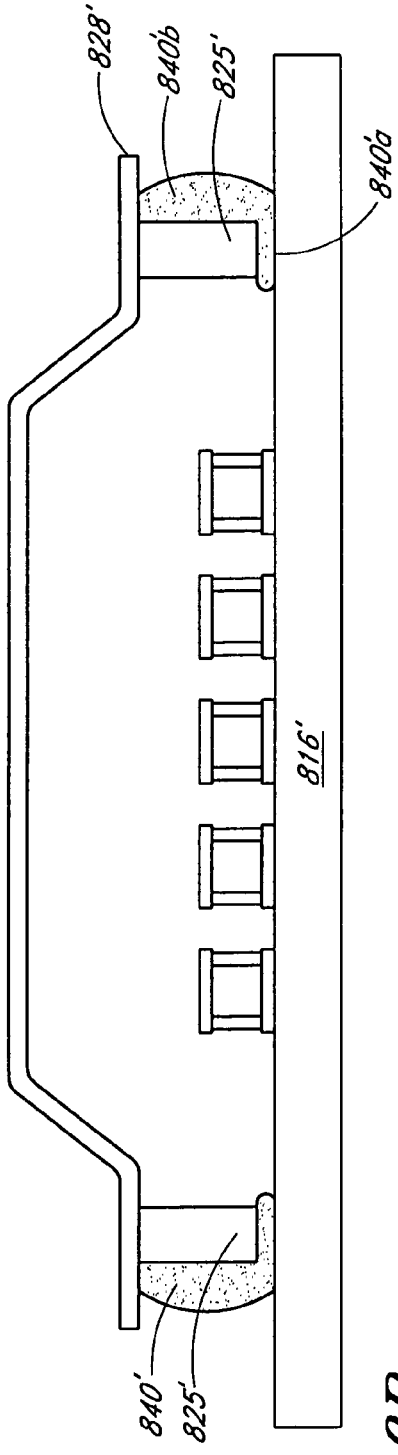
FIG. 8A
FIG. 8B

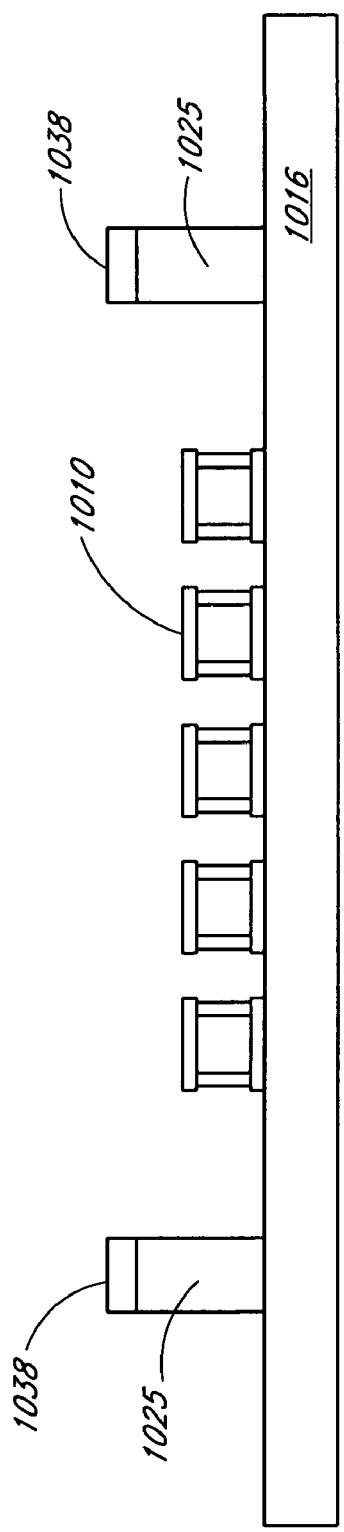
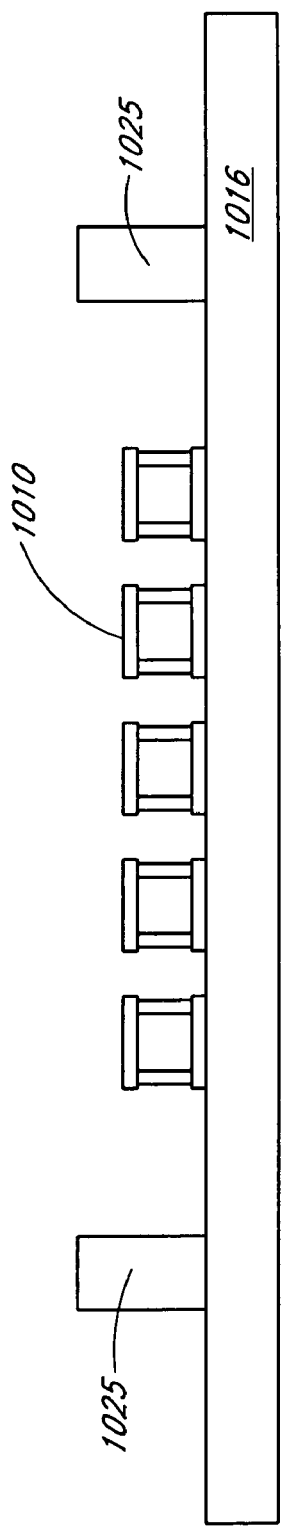
FIG. 10C
FIG. 10D

DEVICE HAVING PATTERNED SPACERS FOR BACKPLATES AND METHOD OF MAKING THE SAME

CROSS-REFERENCE TO RELATED APPLICATIONS

This application claims the benefit of U.S. Patent Application No. 60/613,478, filed on Sep. 27, 2004, the disclosure of which is incorporated by reference in its entirety.

BACKGROUND

1. Field of the Invention

The present disclosure relates generally to microelectromechanical systems devices. More particularly, the disclosure relates to a packaging system for a microelectromechanical systems device.

2. Description of the Related Art

Microelectromechanical systems (MEMS) include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap. Such devices have a wide range of applications, and it would be beneficial in the art to utilize and/or modify the characteristics of these types of devices so that their features can be exploited in improving existing products and creating new products that have not yet been developed.

SUMMARY

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

Described herein are systems, devices, and methods relating to packaging electronic devices, for example, microelectromechanical systems (MEMS) devices, including optical modulators such as interferometric optical modulators. The packaging system disclosed herein comprises a patterned spacer that, in some embodiments, is fabricated using thin-film methods. In some embodiments, the spacer together with a substrate and backplate package an electronic device.

Accordingly, some embodiments provide a packaging structure comprising: a substrate on which a microelectromechanical device is formed, a backplate, and a patterned spacer disposed between the substrate and the backplate.

Other embodiments provide a method for fabricating a packaging structure and a packaging structure fabricated by the method. Some embodiments of the method comprise obtaining a substrate on which a microelectromechanical device is formed; obtaining a backplate; forming a spacer by patterning; and assembling the substrate, backplate, and spacer to provide a packaging structure.

In some embodiments, the microelectromechanical device is an interferometric optical modulator. Some embodiment is an interferometric optical modulator. Some embodiment comprise an array of interferometric optical modulators.

In some embodiments, the patterned spacer is formed on the backplate. In other embodiments, the patterned spacer is formed on the substrate. Some embodiments comprise a plurality of patterned spacers. In some embodiments, the patterned spacer comprises a photoresist. In some embodiments, the photoresist is an epoxy-based photoresist. In some embodiments, the patterned spacer is formed using a mask.

In some embodiments, the substrate comprises a transparent and/or translucent portion, and an image formed on the array of interferometric optical modulators is viewable through the substrate. In some embodiments, the substrate is glass.

In some embodiments, the backplate is a recessed backplate. In other embodiments, the backplate is substantially planar. In some embodiments, the backplate is glass.

In some embodiments, the packaging structure further comprises a desiccant. In some embodiments, the desiccant is secured to the backplate. In some embodiments, the desiccant is calcium oxide.

In some embodiments, the packaging structure further comprises an adhesive disposed between the spacer and the substrate. In other embodiments, the packaging structure further comprises an adhesive disposed between the spacer and the backplate. In some embodiments, the adhesive forms a semi-hermetic seal. In other embodiments, the spacer is thermally welded to the substrate.

BRIEF DESCRIPTION OF THE DRAWINGS

These and other aspects of the invention will be readily apparent from the following description and from the appended drawings (not to scale), which are meant to illustrate and not to limit the invention.

FIG. 7B illustrates in cross section an embodiment of a package structure comprising a recessed backplate. FIG. 7C illustrates in cross section an embodiment of a recessed backplate.

FIG. 8A illustrates in cross section an embodiment of a package structure comprising a plurality of spacers. FIG. 8B illustrates in cross section an embodiment of a package structure in which the spacer acts as a dam for the seal.

FIG. 10A-FIG. 10F illustrate structures formed at different stages of an embodiment of the method illustrated in FIG. 9.

DETAILED DESCRIPTION OF CERTAIN EMBODIMENTS

One embodiment of the invention is a MEMS display device that includes a substrate, a spacer and a backplate. In this embodiment, the substrate can be a transparent substrate that is configured to reflect light from an interferometric modulator array. In this embodiment, the spacer acts as a barrier wall that circumscribes the array, supports the backplate and provides part of a seal between the substrate and the backplate. In one embodiment, spacer is made through photolithographic patterning of organic and/or inorganic materials. The spacer can be patterned onto either the substrate or the backplate. These and other embodiments are described in greater detail below.

The following detailed description is directed to certain specific embodiments of the invention. However, the invention can be embodied in a multitude of different ways. In this description, reference is made to the drawings wherein like parts are designated with like numerals throughout. As will be apparent from the following description, the invention may be implemented in any device that is configured to display an image, whether in motion (e.g., video) or stationary (e.g., still image), and whether textual or pictorial. More particularly, it is contemplated that the invention may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
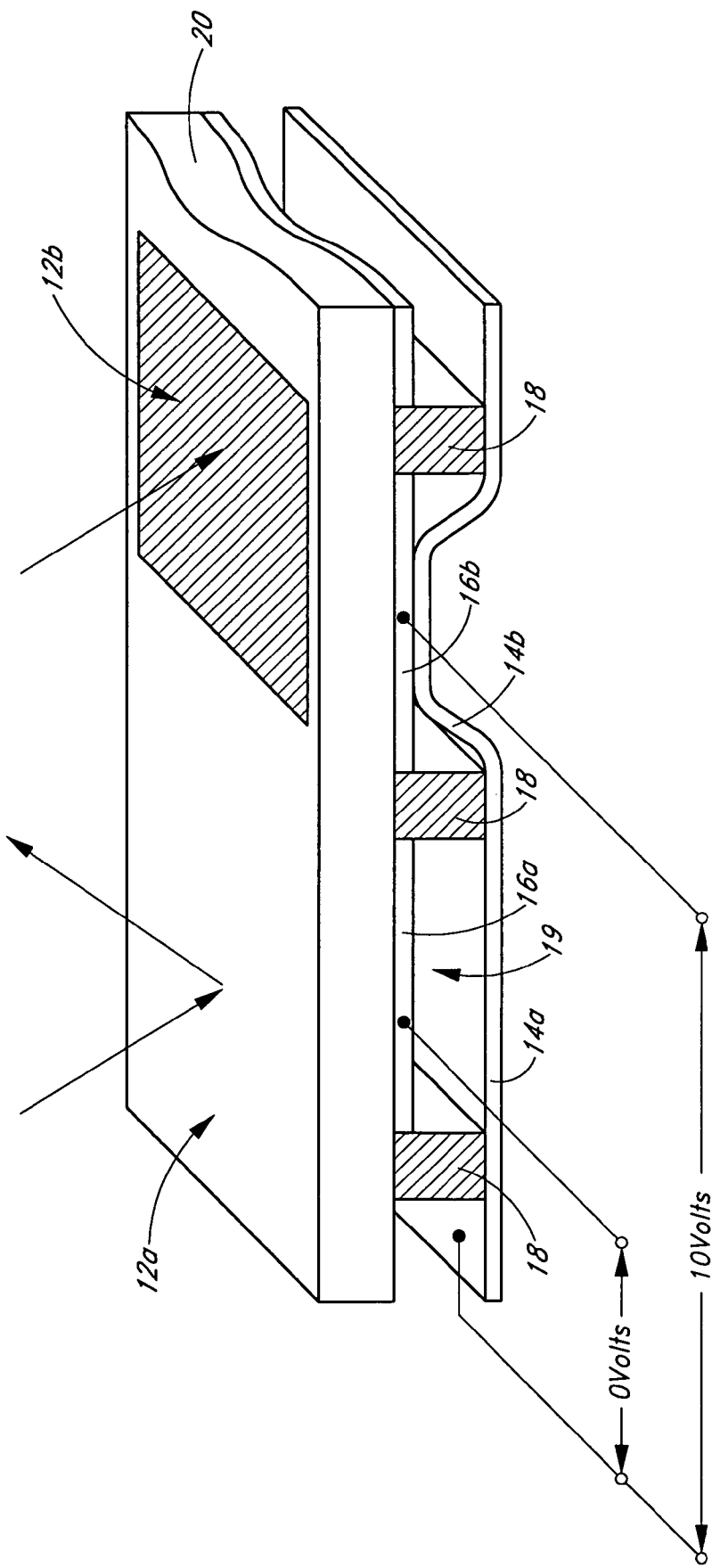
FIG. 1 is an isometric view depicting a portion of one embodiment of an interferometric modulator display in which a movable reflective layer of a first interferometric modulator is in a released position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the released state, the movable layer is positioned at a relatively large distance from a fixed partially reflective layer. In the second position, the movable layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable and highly reflective layer 14a is illustrated in a released position at a predetermined distance from a fixed partially reflective layer 16a. In the interferometric modulator 12b on the right, the movable highly reflective layer 14b is illustrated in an actuated position adjacent to the fixed partially reflective layer 16b.

The fixed layers 16a, 16b are electrically conductive, partially transparent and partially reflective, and may be fabricated, for example, by depositing one or more layers each of chromium and indium-tin-oxide onto a transparent substrate 20. The layers are patterned into parallel strips, and may form row electrodes in a display device as described further below. The movable layers 14a, 14b may be formed as a series of parallel strips of a deposited metal layer or layers (orthogonal to the row electrodes 16a, 16b) deposited on top of posts 18 and an intervening sacrificial material deposited between the posts 18. When the sacrificial material is etched away, the deformable metal layers are separated from the fixed metal layers by a defined air gap 19. A highly conductive and reflective material such as aluminum may be used for the deformable layers, and these strips may form column electrodes in a display device.

With no applied voltage, the cavity 19 remains between the layers 14a, 16a and the deformable layer is in a mechanically relaxed state as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable layer is deformed and is forced against the fixed layer (a dielectric material which is not illustrated in this Figure may be deposited on the fixed layer to prevent shorting and control the separation distance) as illustrated by the pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
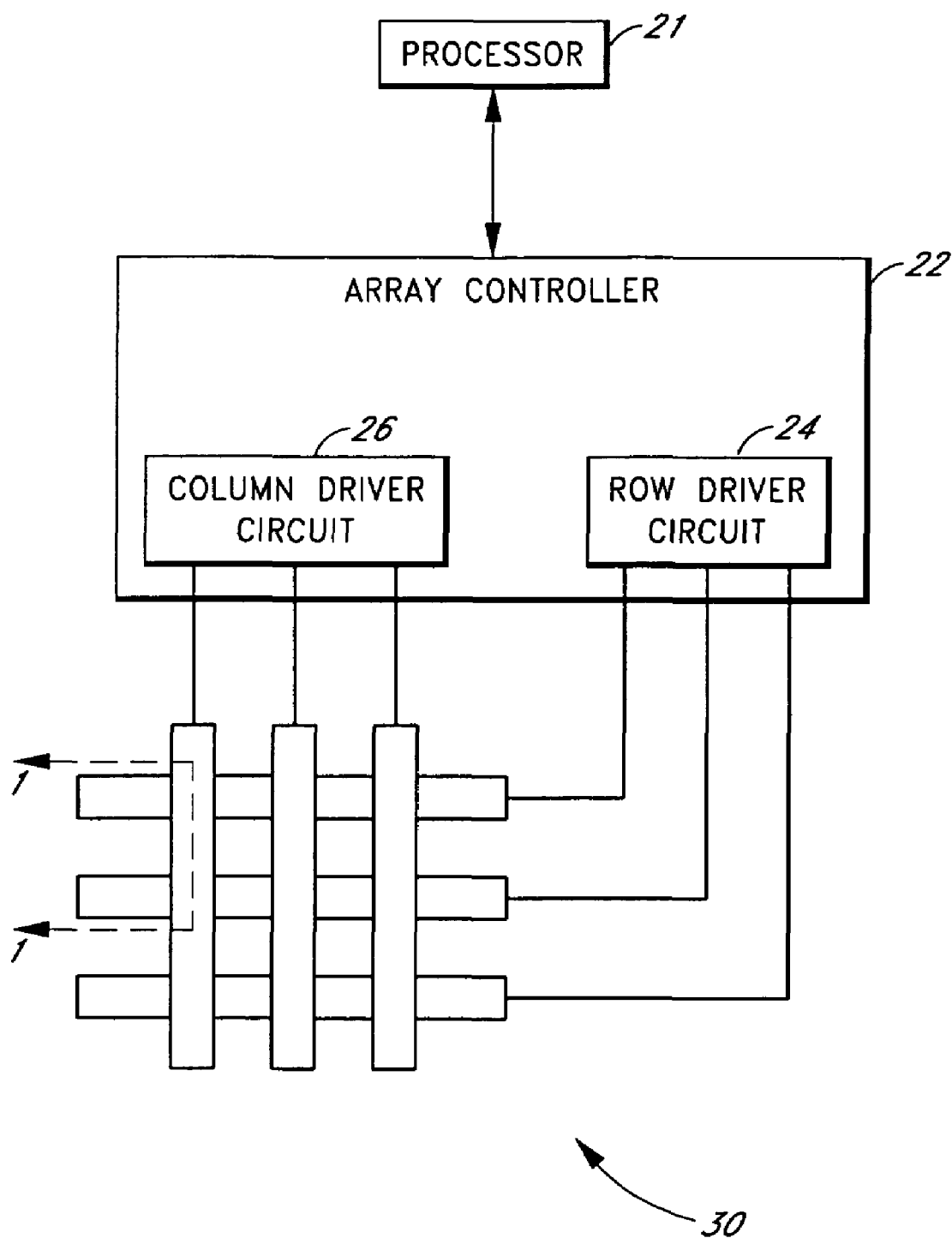
FIG. 2 is a system block diagram illustrating one embodiment of an electronic device incorporating a 3×3 interferometric modulator display.

FIG. 2 through FIG. 5 illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array controller 22. In one embodiment, the array controller 22 includes a row driver circuit 24 and a column driver circuit 26 that provide signals to a pixel array 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the released state to the actuated state. However, when the voltage is reduced from that value, the movable layer maintains its state as the voltage drops back below 10 volts. In the exemplary embodiment of FIG. 3, the movable layer does not release completely until the voltage drops below 2 volts. There is thus a range of voltage, about 3 to 7 V in the example illustrated in FIG. 3, where there exists a window of applied voltage within which the device is stable in either the released or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be released are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or released pre-existing state. Since each pixel of the interferometric modulator, whether in the actuated or released state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
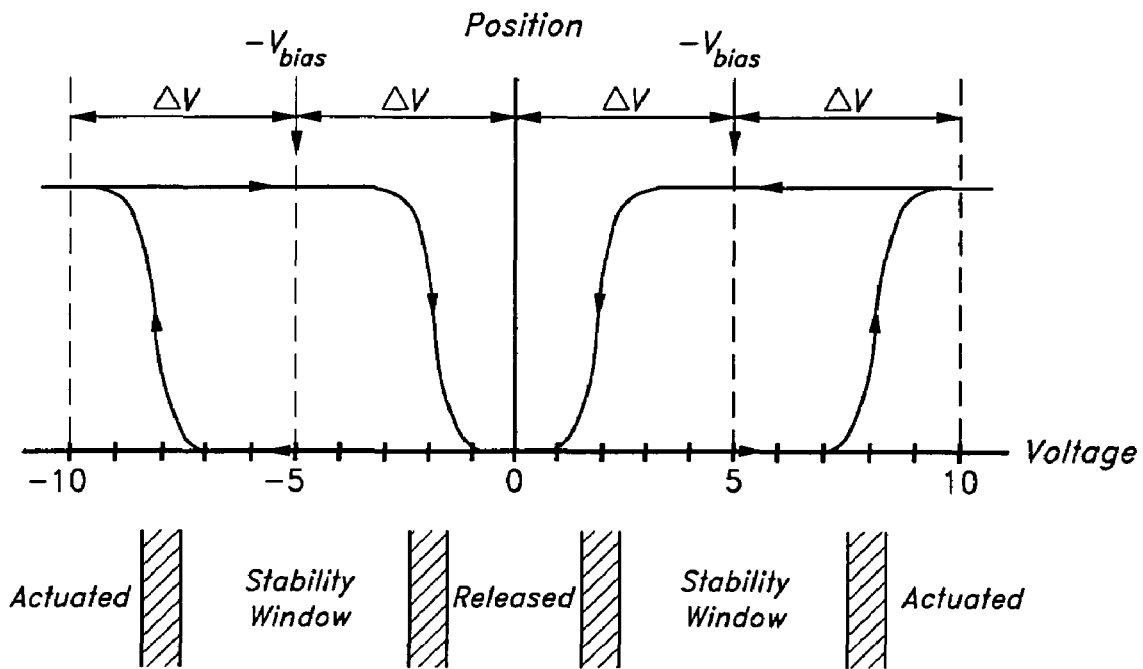
FIG. 3 is a diagram of movable mirror position versus applied voltage for one exemplary embodiment of an interferometric modulator of FIG. 1.
FIG. 4 is an illustration of sets of row and column voltages that may be used to drive an interferometric modulator display.

FIG. 4 and FIG. 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Releasing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$.

Figure 5A:
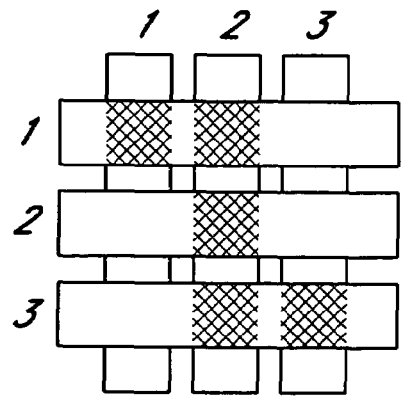
FIG. 5A and FIG. 5B illustrate one exemplary timing diagram for row and column signals that may be used to write a frame of display data to the 3×3 interferometric modulator display of FIG. 2.
Figure 5B:
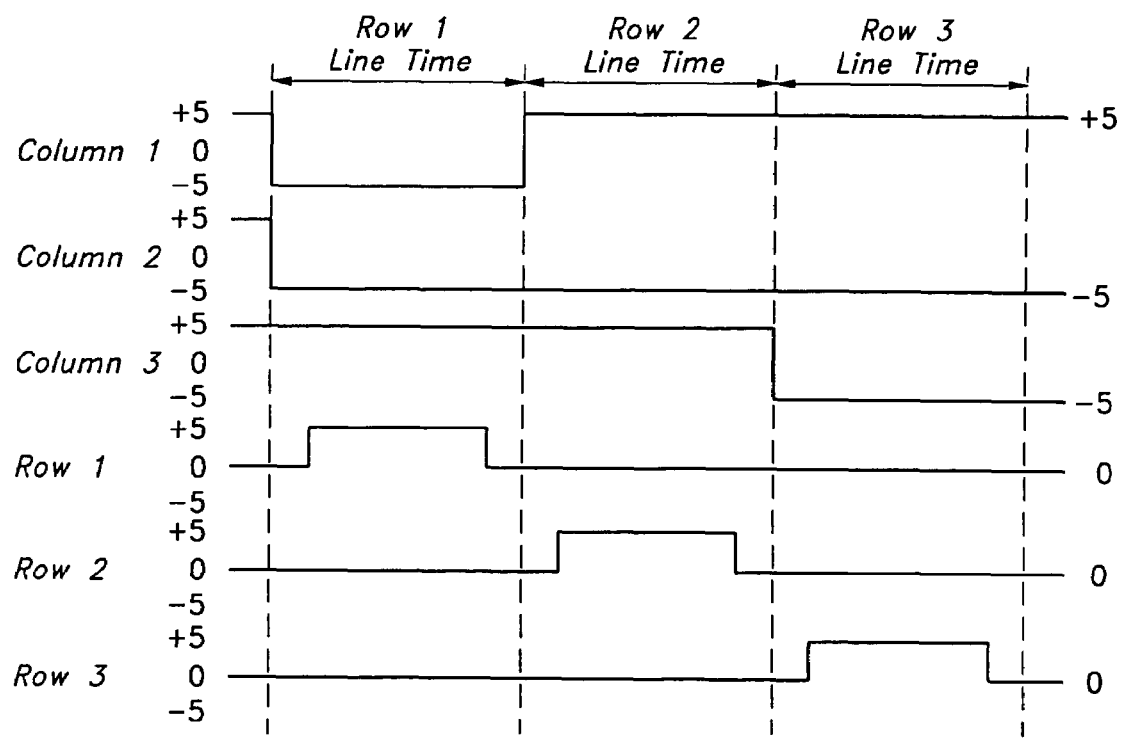

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or released states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2 ) pixels and releases the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and release pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the present invention.

Figure 6A:
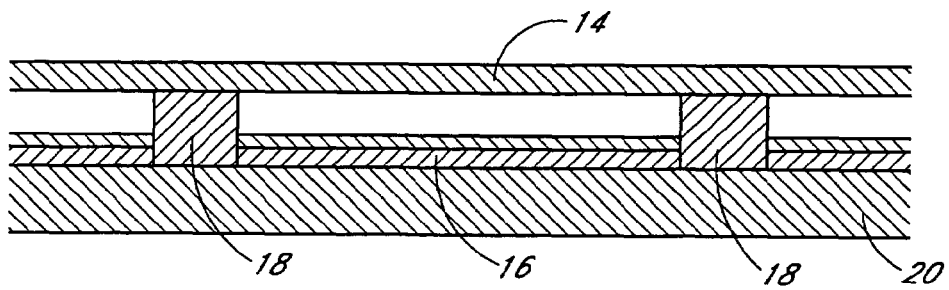
FIG. 6A is a cross section of the device of FIG. 1.
Figure 6B:
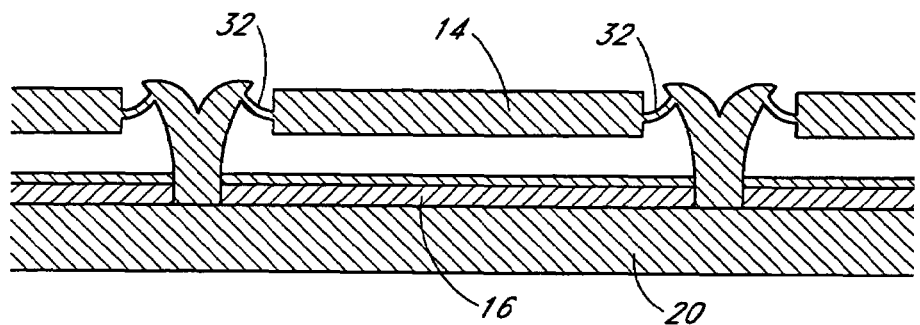
FIG. 6B is a cross section of an alternative embodiment of an interferometric modulator.
Figure 6C:
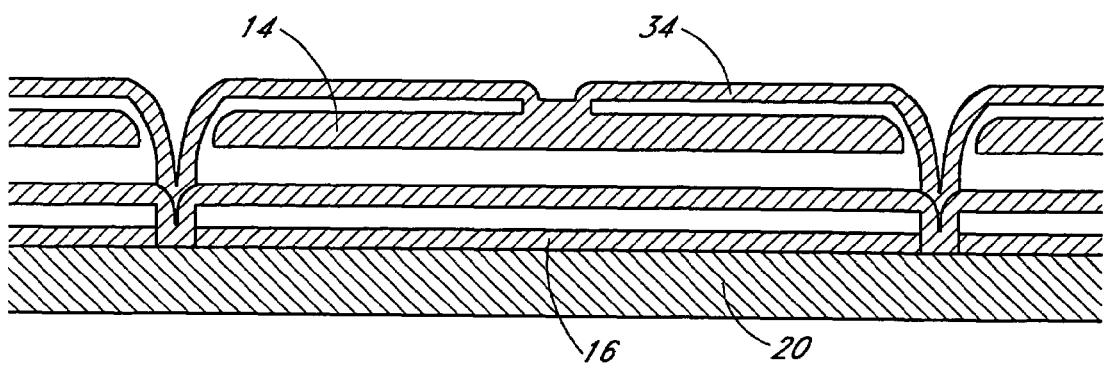
FIG. 6C is a cross section of an alternative embodiment of an interferometric modulator

The details of the structure of interferometric modulators that operate in accordance with the principles set forth above may vary widely. For example, FIG. 6A-FIG. 6C illustrate three different embodiments of the moving mirror structure. FIG. 6A is a cross section of the embodiment of FIG. 1, where a strip of metal material 14 is deposited on orthogonally extending supports 18. In FIG. 6B, the moveable reflective material 14 is attached to supports at the corners only, on tethers 32. In FIG. 6C, the moveable reflective material 14 is suspended from a deformable layer 34. This embodiment has benefits because the structural design and materials used for the reflective material 14 can be optimized with respect to the optical properties, and the structural design and materials used for the deformable layer 34 can be optimized with respect to desired mechanical properties. The production of various types of interferometric devices is described in a variety of published documents, including, for example, U.S. Published Application 2004/0051929. A wide variety of well known techniques may be used to produce the above described structures involving a series of material deposition, patterning, and etching steps.

The term "modulator" is used herein to refer to an interferometric optical modulator. The spacer is also referred to herein as a "wall" or "support."

Figure 7A:
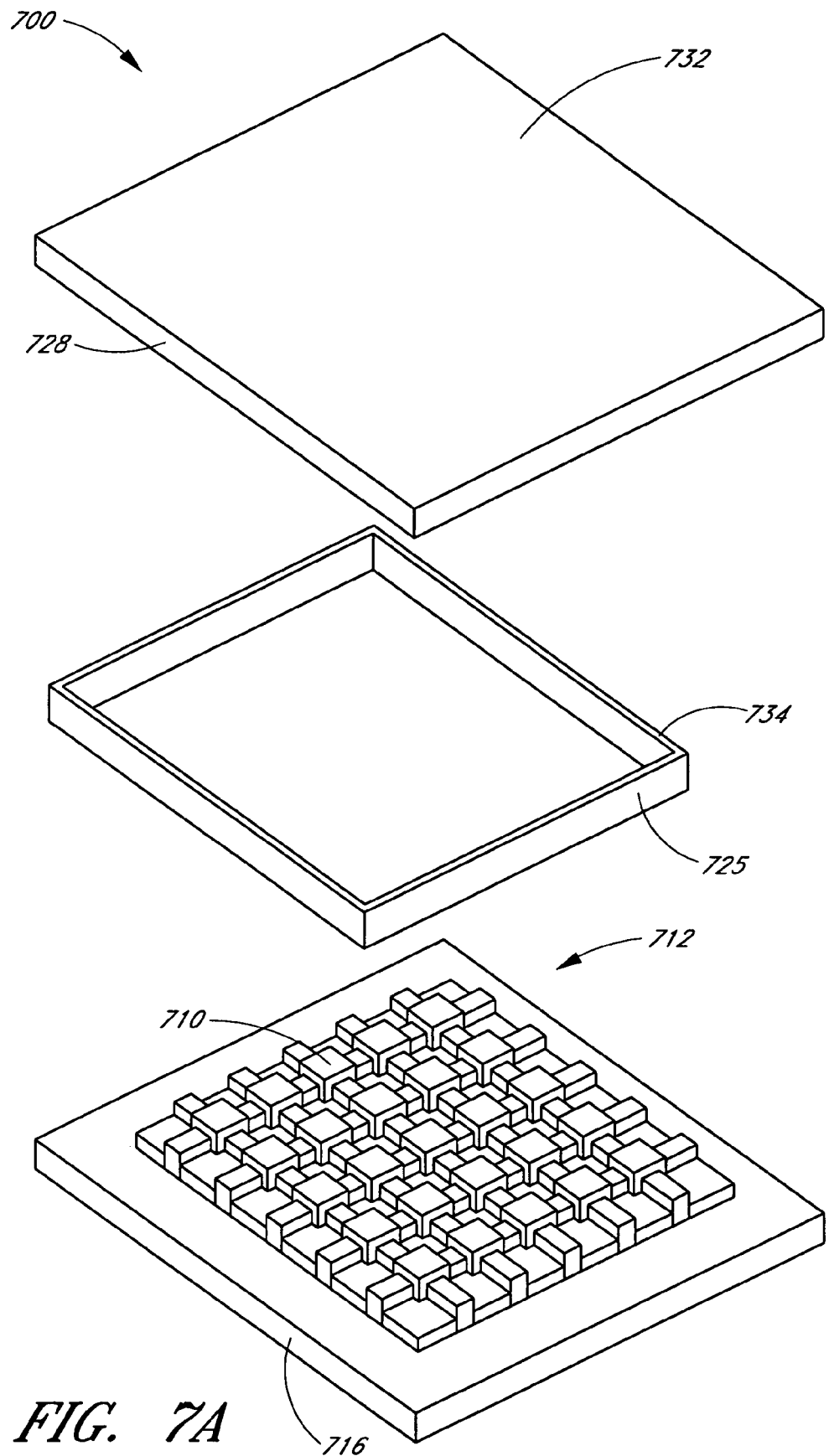
FIG. 7A is an exploded view schematically illustrating an embodiment of a package structure comprising a patterned spacer.

FIG. 7A is an exploded view of an embodiment of a packaging structure 700 comprising a backplate 728, a spacer 725, and a substrate 716. In the illustrated embodiment, the backplate 728, spacer 725, and substrate 716 together package an array 712 of modulators 710. Because the package structure 700 is useful as a display, it is also referred to herein as a "package display." As described above, in some embodiments, at least a portion of the substrate 716 transparent and/or translucent, and an image formed by the array 712 is viewable through the transparent and/or translucent portion of the substrate. In other embodiments, the backplate 728 comprises a transparent and/or translucent portion and an image formed on the array 712 is viewable through the backplate 728.

In embodiments in which an image is viewable through the transparent and/or translucent substrate 716, the backplate 728 is disposed behind the array 712 of modulators. The backplate 728 comprises a first side proximal to the array 712, which is not visible in the orientation illustrated in FIG. 7A. A second side 732 of the backplate is distal of the array 712 of modulators as illustrated in FIG. 7A.

The backplate 728 in the embodiment illustrated in FIG. 7A is generally planar. In the illustrated embodiment, both the first side (not shown) and the second side 732 comprise generally planar surfaces. Some embodiments of a generally planar backplate 728 are less difficult to manufacture and thus less expensive than backplates with non-planar surfaces. Some embodiments of a planar backplate 728 are also more robust. The package structure 700, however, need not be restricted to use of a completely planar backplate 728 as the first side or the second side 732 may be contoured in other embodiments.

In some embodiments, the backplate 728 comprises a material that is substantially impermeable to moisture. As discussed in greater detail below, the performance of some embodiments of the modulator 710 is degraded by moisture, for example, condensed water, on and/or between the mirrors 14a and 16a as illustrated in FIG. 1. In some embodiments, the backplate 728 comprises a metal (e.g., steel, stainless steel, aluminum, magnesium, titanium, brass, copper, and alloys thereof), a glass (e.g., borosilicate glass, high silica glass, silica, alumina, and combinations thereof) a semiconductor material (e.g., silicon), a plastic and/or other polymer (e.g., parylene, epoxies, polyamides, polyalkenes, polyesters, polysulfones, polystyrene, polyurethanes, polyacrylates), a ceramic, or a combination or composite thereof. In some embodiments, the backplate 728 comprises a composite material, for example, a fiber reinforced polymer resin. Preferably, the backplate 728 does not produce particulates or outgas vapors that interfere with the operation of the modulators 710. In some embodiments, the backplate 728 is coated to reduce or prevent particulate or vapors that degrade the performance and/or reliability of some embodiments of the modulator 710.

In some embodiments, the backplate 728 is from about 0.5 mm to about 5 mm thick. In some preferred embodiments, the backplate 728 is from about 0.5 mm to about 2 mm thick, for example, about 0.6 mm, about 0.7 mm, about 0.8 mm, about 0.9 mm, about 1 mm, about 1.2 mm, about 1.3 mm, about 1.4 mm, about 1.5 mm, about 1.6 mm, about 1.7 mm, about 1.8 mm, or about 1.9 mm thick. In other preferred embodiments, the backplate 728 is from about 2 mm to about 5 mm thick, for example, about 2.5 mm, about 3 mm, about 3.5 mm, 4 mm, or about 4.5. In other embodiments, the thickness of the backplate 728 is outside this range.

In the embodiment depicted in FIG. 7A, the spacer 725 forms a barrier or wall extending around and circumscribing the array 712 of modulators 710. As discussed in greater detail below, in some embodiments, the spacer is fabricated using thin-film methods. The spacer 725 has a preselected width sufficient to support the backplate 728. In some embodiments, the width of the spacer 725 is also selected to inhibit the infiltration of water vapor into display package 700. As discussed above, water condensation in or on some embodiments of the modulator 710 degrades its performance. Those skilled in the art will understand that the intrinsic water permeability of a material from which the spacer is fabricated will, in part, determine the height and width of the spacer 725 in embodiments in which the spacer 725 inhibits the infiltration of water vapor into the package structure 700. The particular width or widths required to achieve either or both of these aims depends on factors including the material used to fabricate the spacer 725, the environmental conditions under which the display package 700 will be deployed, the presence or absence of a desiccant (discussed below), and the like. In some embodiments, the spacer 725 forms a hermetic and/or semi-hermetic seal. In some embodiments, the width of the spacer 725 is from about 0.5 mm to about 5 mm wide. In some preferred embodiments, the width of the spacer is from about 1 mm to about 2 mm, for example about 1.1 mm, about 1.2 mm, about 1.3 mm, about 1.4 mm, about 1.5 mm, about 1.6 mm, about 1.7 mm, about 1.8 mm, or about 1.9 mm. In other embodiments, the width of the spacer 725 is outside of this range. In some embodiments, the width of the spacer 725 is substantially uniform. In other embodiments, the width of the spacer 725 is non-uniform.

In some embodiments, the height of the spacer 725 is selected to prevent the backplate 728 from contacting the modulators 710. The distance between the top to the array 712 and the first side of the backplate 728 is also referred to herein as the "headspace." In some embodiments, physical contact between the backplate 728 and the modulators 710 is capable of damaging or otherwise interfering with the operation of the modulators 710. Accordingly, in the embodiment illustrated in FIG. 7A, the height of the spacer 725 is greater than the height of the optical modulators 710. Those skilled in the art will realize that typically, backplates with longer lengths and/or widths are susceptible to larger deflections. Accordingly, in some embodiments, a device 700 with a larger backplate will also have a larger headspace. In some embodiments, the height of the spacer is from about 0.5 μm to about 5 mm. In some preferred embodiments, the height of the spacer is from about 0.5 μm to about 100 μm, from about 0.5 μm to about 50 μm, or from about 0.5 μm to about 5 μm. For example, in some embodiments, the height of the spacer is about 1 μm, about 2 μm, about 3 μm, about 4 μm, about 5 μm, about 6 μm, about 7 μm, about 8 μm, or about 9 μm. Such embodiments are useful, for example, in embodiments using recessed backplates, which are discussed in greater detail below. In other preferred embodiments, the height of the spacer is from about 100 μm to about 500 μm, for example, about 150 μm, about 200 μm, about 250 μm, about 300 μm, about 350 μm, about 400 μm, or about 450 μm. In other embodiments, the height is in a different range. In some embodiments, the height of the spacer 725 is substantially uniform. In other embodiments, the height of the spacer 725 is non-uniform.

The spacer 725 can comprise a material amenable to photolithographic patterning. Photolithographic patterning provides a simple and inexpensive method for fabricating a spacer 725 with precise dimensions and/or positioning compared with other methods. Suitable materials include any material that is capable of photolithographic patterning, including organic and/or inorganic materials. Suitable materials are directly photopatternable (photodefinable) and/or indirectly photopatternable, for example, using a mask and an etchant. Materials that may be photolithographically patterned advantageously can be formed into a variety of shapes and sizes with a high degree of control and precision. Additionally, a wide range of materials and processes for patterning have been developed and are conventionally used in the manufacture of integrated semiconductor devices, for example, integrated circuits (ICs). The particular material selected will depend on factors known in the art, for example, physical strength, electrical conductivity, water transport properties, fabrication conditions, manufacturability, and the like. Exemplary materials include photoresists, other photopatternable materials, planarization materials, metals, dielectrics, semiconductors, polymers, and the like. In some embodiments the material is a composite, alloy, copolymer, and/or blend. One example of a suitable photoresist is SU-8 available from MicroChem Corp. (Newton, Mass.), which is an epoxy-based photoresist. An example of an indirectly photopatternable material is parylene (paraxylylene polymers). Suitable metals include aluminum and copper. Other materials may also be employed. The present application contemplates the use of both known materials and processes, as well as other materials and processes, yet to be discovered or devised.

Some embodiments further comprise a desiccant (not illustrated) in the package structure 700, which absorbs moisture therein. As discussed above, some embodiments of the modulators 710 are negatively affected by moisture. Providing a desiccant in such embodiments improves the performance and/or reliability of the device.

Generally, the desiccant is any substance that absorbs moisture, while not interfering with the operation of the modulators 710. Suitable desiccant materials include, but are not limited to, zeolites, molecular sieves, surface adsorbents, bulk adsorbents, and compounds that react with water. Factors contributing to the selection of the desiccant include the expected amount of moisture to be absorbed, as well as the absorption characteristics of the desiccant, including the rate; and volume available for the desiccant. The desiccant has any suitable shape, form, and/or size, and may be applied in any suitable way.

It should be realized that the process of manufacturing the package 700 is not limited to fabricating the spacer 725 on the substrate 716. For example, as discussed below, in some embodiments, the spacer 725 is fabricated on the first side of the backplate 728. In either case, the array 712 of modulators 710 is encapsulated within the package structure 700, as discussed more fully below.

In some embodiments, an adhesive (not illustrated) is applied to a contact surface 734 of the spacer, which corresponds to an area on the backplate 728 that contacts the spacer 725. In other embodiments, the contact surface 734 corresponds to an area of the substrate 716 that contacts the spacer 725. The adhesive is selected to provide sufficient strength to secure the package structure 700. In some embodiments, the adhesive is also selected to provide sufficient durability against the expected environmental conditions for the display package 700, including, for example, temperature variations and/or physical impact. Suitable adhesives are known in the art. Those skilled in the art will understand that in embodiments using an adhesive, the distance between the substrate 716 and the backplate 728 will depend on the thicknesses of the adhesive and the spacer 725.

As discussed above, condensed water interferes with the operation of some modulators 710. Accordingly, in some embodiments, the seal formed by the adhesive substantially inhibits any water vapor from infiltrating into the package structure 700. For example, in some embodiments, the seal formed by the adhesive has a water vapor permeability of from about 0.2 g·mm/m$^2$·kPa·day to about 4.7 g·mm/m$^2$·kPa·day. A seal with a water vapor permeability within this range is referred to herein as a "semi-hermetic seal." In other embodiments, the seal is more or less permeable to water vapor. In some embodiments, the seal comprises a substantially hermetic seal.

In embodiments using an adhesive, the dimensions of the seal formed by the adhesive affects the permeation of the water vapor. In some embodiments, the adhesive seal is from about 0.5 mm to about 5 mm wide. In some preferred embodiments, the adhesive seal is from about 1 mm to about 2 mm wide. In some embodiments, the width of the adhesive seal is substantially the same as the width of the spacer. In other embodiments, the width of the adhesive seal is different from the width of the spacer. For example, in some embodiments, the width of the adhesive seal is narrower than the width of the spacer. In other embodiments, the width of the adhesive seal is wider than the width of the spacer. In some embodiments, the adhesive seal has a non-uniform width. In some embodiments, the adhesive seal is from about 2 µm to about 200 µm thick. In some preferred embodiments, the adhesive seal is less than about 20 µm thick. In some preferred embodiments, the adhesive seal is from about 5 µm to about 10 µm thick. In other embodiments, the adhesive seal has other dimensions. In some embodiments, the thickness of the adhesive seal is substantially uniform. In other embodiments, the thickness of the adhesive seal is non-uniform. Those skilled in the art will understand that the dimensions of the seal in a particular application depends on factors including the type of material, the mechanical properties thereof, and the permeability thereof.

In some embodiments, the adhesive comprises a UV and/or thermally curable adhesive. In some embodiments, the adhesive comprises an epoxy-based adhesive. In other embodiments, the adhesive comprises another type of adhesive, for example, polyurethane, polyisobutylene, silicone, and the like. In other embodiments, the seal comprises a polymer or a plastic. In other embodiments, the seal is liquid spin-on glass, a gasket (e.g., an O-ring), solder, a thin film metal weld, or a glass frit. In some embodiments, the spacer 725 is directly sealed to the substrate 716 or backplate 728, for example, by thermal welding. Those skilled in the art will understand that other types of seals are also possible.

Another embodiment of a packaging structure 700' is illustrated in cross-section in FIG. 7B. The packaging structure 700' comprises a substrate 716' with an array 712' of modulators 710' formed thereon, a spacer 725', a backplate 728', and a desiccant 744'. In the illustrated embodiment, the substrate 716', modulators 710', spacer 725', and desiccant 744' are as described above. In the illustrated embodiment, the backplate 728' comprises a first side 730' and a second side 732'. The first side 730' comprises a concave portion or recess 731'. Accordingly, a backplate 728' with this configuration is also referred to herein as a "recessed backplate." The illustrated embodiment also comprises an optional flange 733'. In the illustrated embodiment, the second side 732' comprises a convex portion, which is also optional. An embodiment of a recessed backplate 728" that does not comprise a flange and/or a convex portion on the second side 732" is illustrated in FIG. 7C. As in the embodiment illustrated in FIG. 7B, a recess 731" is formed on the first side of the backplate.

Returning to FIG. 7B, in some embodiments, the concave portion 731' provides additional clearance or headspace between the array 712' and the first side 730' of the backplate, thereby reducing the likelihood that a modulator 710' will contact the backplate 728' either while the display package 700' is in use or during fabrication. In other embodiments, a desiccant 744' is disposed in the recess 731' of the backplate. In other embodiments, the recess 731' permits the use of a shorter spacer 725' with the same headspace between the array 712' and the first side 730' of the backplate.

Embodiments of the recessed backplates 728' and 728" illustrated in FIG. 7B and FIG. 7C are fabricated from the materials discussed above. In some embodiments, the recessed backplate is glass, borosilicate glass, high-silica glass, silica, and/or alumina. In other embodiments, the recessed backplate is metal, stainless steel, aluminum, or the like. In other embodiments, the recessed backplate comprises a polymer resin, for example, a polyalkene, polyamide, polyester, epoxy resin, or a copolymer and/or blend thereof. In some embodiments, the recessed backplate is a composite, for example, comprising reinforcing and/or electrically conductive fibers.

Those skilled in the art will understand that the thickness of the recessed backplate will depend on the dimensions of the recessed backplate, the material from which it is fabricated, the desired rigidity, transparency, and the like. Moreover, some embodiments of the recessed backplate, for example, the embodiment illustrated in FIG. 7C have a non-uniform thickness. In some embodiments, the thinnest region of the concave portion is at least from about 0.5 mm to about 5 mm thick. In some embodiments, the recess is from about 50 µm to about 5 mm deep. In some preferred embodiments, the recess is from about 100 µm to about 500 µm deep, for example, about 150 µm, about 200 µm, about 250 µm, about 300 µm, about 350 µm, about 400 µm, or about 450 µm deep.

Those skilled in the art will understand that the particular method of fabricating the recessed backplate will depend on factors including the material or materials that comprise the recessed backplate, the dimensions, the tolerances, and the like. Suitable methods include etching, machining, stamping, embossing, forging, peening, grinding, attritting, and the like. In some embodiments, the recessed backplate is monolithic. In other embodiments, the recessed backplate comprises subassemblies or subparts, for example, a separate flange.

Some embodiments of the packaging structure comprise a plurality of spacers. FIG. 8A illustrates an embodiment of a packaging structure 800 that comprises a substrate 816 with an array 812 of modulators 810 formed thereon, a backplate 828, and a desiccant 844. The illustrated package structure 800 further comprises a first spacer 825 and a second spacer 826 nested therein. In the illustrated embodiment, a desiccant 848 is disposed in the region 846 between the first and second spacers 825 and 826. Other embodiments do not comprise a desiccant between the first and second spacers 825 and 826. In some embodiments, the second spacer 826 acts as a back-up in the event of failure to the first spacer 825, for example, under extreme environmental conditions and/or in mission critical applications. In other embodiments, the second spacer 826 is relatively permeable to water vapor, thereby permitting any water vapor in and around the array 812 to pass through the second spacer 826 and for absorption by the desiccant 848. In some embodiments, the second spacer 826 permits the use of a desiccant 848 that may otherwise be unacceptable, for example, a desiccant in the form of a fine powder, a desiccant that generates a powder, a desiccant that generates a vapor, and the like. The illustrated configuration also permits the use of a greater amount of desiccant, thereby increasing the reliability of the device. Other embodiments comprise additional spacers.

In the embodiment of a packaging structure 800' illustrated in FIG. 8B, the spacer 825' is formed on a recessed cap 828'. A seal 840' extends between a substrate 816' and a backplate 828', and surrounds the spacer 825'. In the illustrated embodiment, a portion 840'a of the seal is disposed between the spacer 825' and the substrate 816'. In embodiments in which the spacer 825' is formed on the substrate 816', the portion 840'a of the seal is disposed between the spacer 825' and the backplate 828'. In some embodiments, the height of portion 840'a is less than about 20 µm, for example from about 5 µm to about 10 µm. In some embodiments, the portion of the seal 840'b that extends between the substrate 816' and the backplate 828' serves as a primary barrier layer and the spacer 825' acts as a secondary barrier layer. Accordingly, in some embodiments, the seal material is selected to provide a hermetic or semi-hermetic seal. In other embodiments, the spacer 825' is the primary moisture barrier. Suitable materials for the seal 840' are described above. In some preferred embodiments, the seal 840' is an adhesive, for example, an epoxy, silicone, urethane, and the like.

In some embodiments, the spacer 825' acts as a dam, reducing the flow of adhesive into the interior of the package structure 800' during its fabrication. In some embodiments, the dam effect of the spacer 825' permits positioning the seal 840' closer to the center of the package structure 800', thereby permitting the manufacture of a smaller device. In an embodiment of a method for manufacturing the package structure 800', a spacer 825' is formed on the backplate 828'. A bead of adhesive is applied to the contact area of the substrate 816'. The adhesive forms the seal 840'. The backplate 828' and substrate 816' are then positioned, one above the other. As the backplate 828' and substrate 816' are brought together, the spacer 825' contacts the bead of adhesive. As the components are brought closer together, the adhesive tends to flow towards the outside of the spacer 825' because the air trapped within the device prevents substantial adhesive flow towards the inside. The layer of adhesive remaining between the substrate 816' and the spacer 825' forms portion 840'a of the seal. The adhesive that flows around the outside of the spacer 825' forms portion 840'b of the seal.

Figure 9:
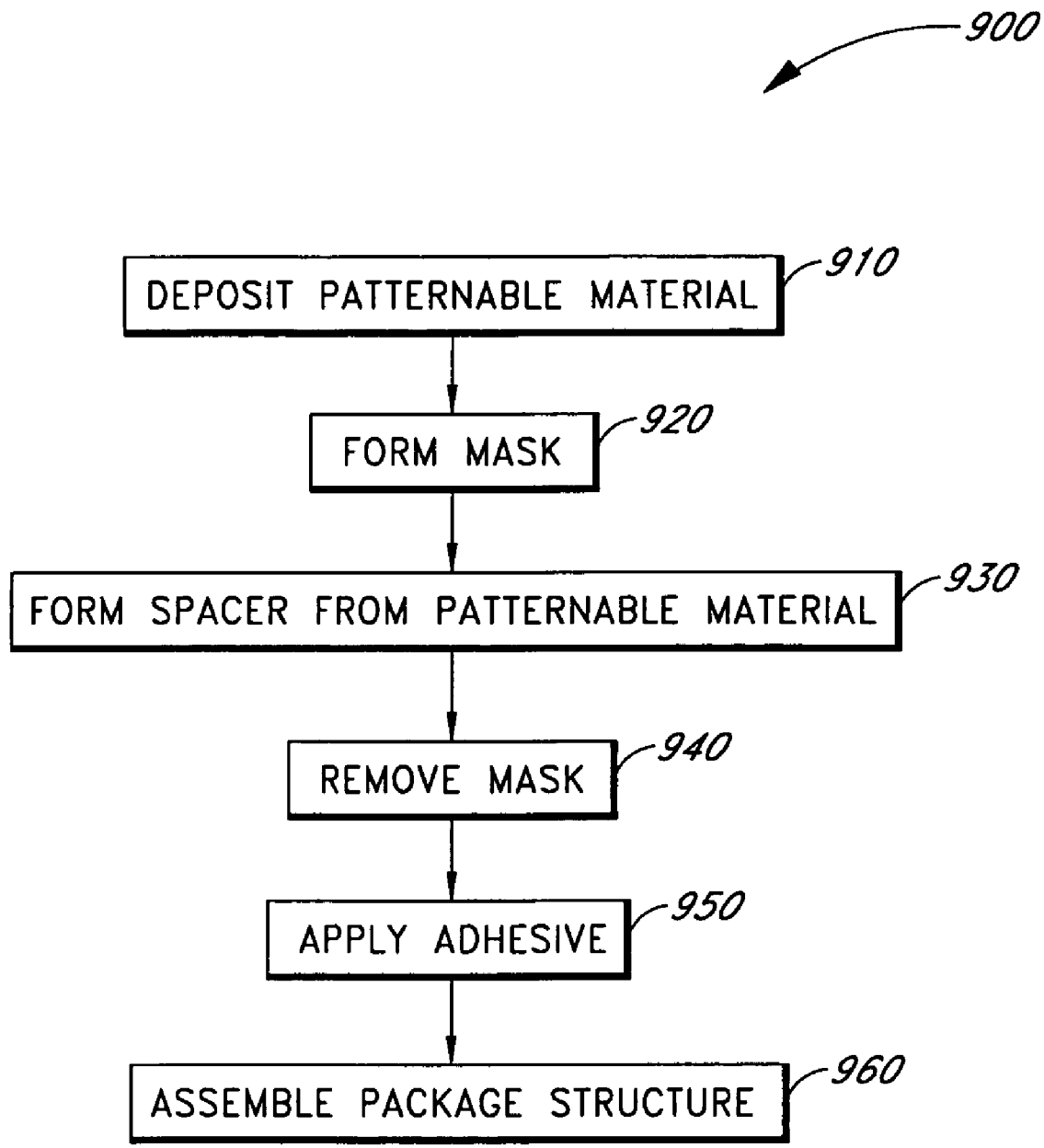
FIG. 9 is a flowchart illustrating an embodiment of a method for fabricating a package structure comprising a patterned spacer.

FIG. 9 is a flowchart of an embodiment of a method for fabricating a packaging structure with reference to the structures illustrated in cross section in FIG. 10A-FIG. 10F, which schematically illustrate an embodiment of the process of FIG. 9.

Figure 10A:
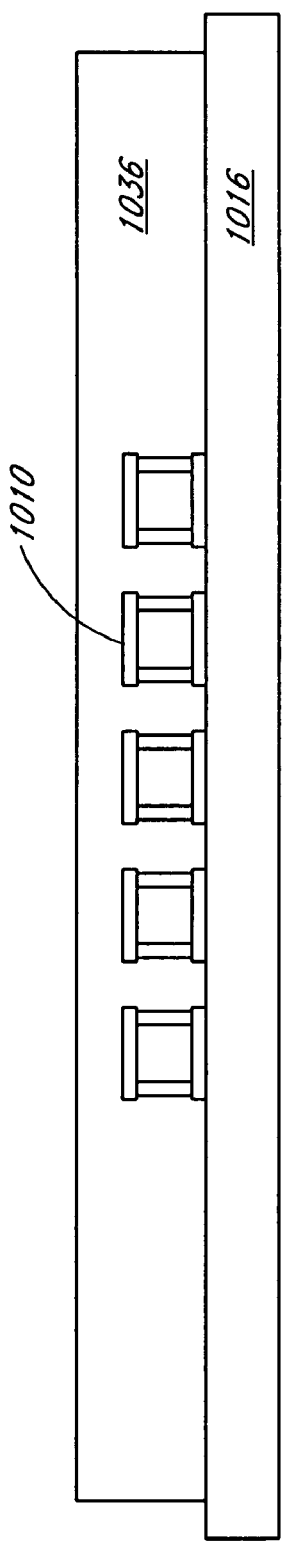

In step 910, a layer of patternable material 1036 is deposited. Suitable materials are discussed above. In the embodiment illustrated in FIG. 10A, the patternable material 1036 is deposited over a substrate 1016 and interferometric modulators 1010 supported thereon. The modulators 1010 on a surface of the substrate 1016 illustrated in FIG. 10A are fabricated in an earlier process, for example, a process described U.S. Published Application 2004/0051929. Those skilled in the art will understand that other processes are useful for fabricating either the same type of modulator 1010 or other types modulators, all of which are contemplated as within the present disclosure. Those skilled in the art will also understand that the systems, apparatus, and methods disclosed herein are also applicable to other types of MEMS structures. In other embodiments discussed in more detail below, the patternable material 1036 is deposited on the backplate 1028.

The layer of patternable material 1036 is deposited using any suitable method known in the art, for example, spin coating, sputtering, physical vapor deposition, chemical vapor deposition, and the like. Those skilled in the art will understand that the particular method or methods used to deposit the layer depends on the particular patternable material or materials used. In the embodiment illustrated in FIG. 10A, the layer of patternable material 1036 covers the modulators 1010. In other embodiments, the layer of patternable material 1036 does not cover the modulators 1010. In the illustrated embodiment, the thickness of the layer of patternable material 1036 depends on the desired separation between the substrate 1016 and/or the tops of the modulators 1010, and the backplate 1028 (illustrated in FIG. 10E). In some embodiments, the desired separation between the substrate 1016 and the backplate 1028 (the headspace) is from about 100 µm to about 5 mm. Consequently, the layer of patternable material 1036 has the same or a similar thickness. In other embodiments, the desired separation between the substrate 1016 and/or the tops of the modulators 1010, and the backplate 1028 has a different value, and the thickness of the layer of patternable material 1036 is adjusted accordingly. As discussed above, a recessed backplate, for example as illustrated in FIG. 7B, provides an equivalent headspace using a shorter spacer 1025.

Figure 10B:
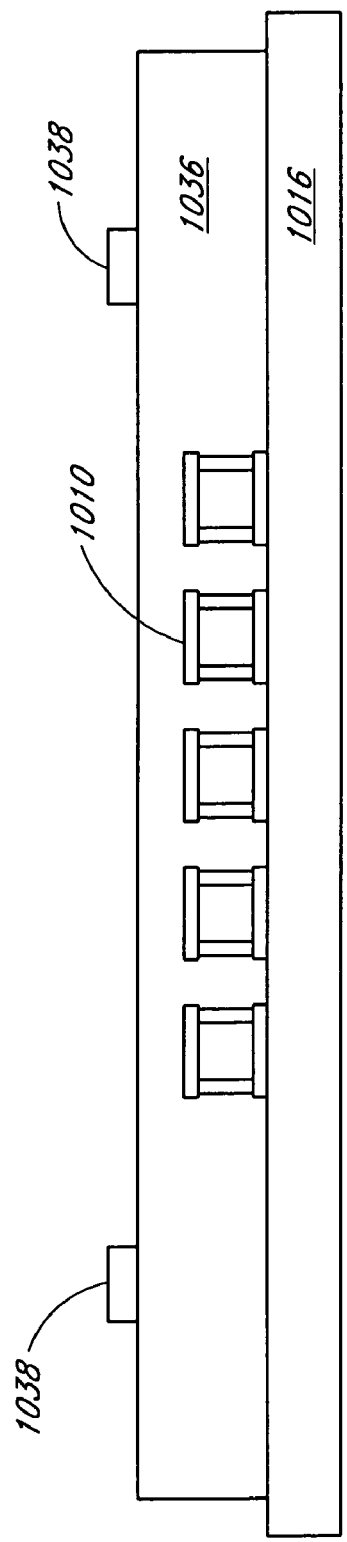

In step 920, a mask 1038 is formed on the layer of patternable material 1036, as illustrated in FIG. 10B. The particular material and method used for forming the mask 1038 depends on factors known to those skilled in the art, including, for example, the particular patternable material, the curing conditions for the mask material, the etching conditions for the mask material, the etching conditions for the patternable material, the materials used in the fabrication of the modulators 1010, the substrate, subsequent process steps and materials, and the like. In some embodiments, the mask 1038 comprises a photoresist. In some embodiments, the photoresist is a positive resist. In other embodiments, the photoresist is a negative resist. In embodiments using a photoresist, the mask 1038 is formed using a process comprising exposing the photoresist using a suitable radiation source and pattern, and developed the exposed material to provide a mask 1038 with the desired pattern. Those skilled in the art will understand that other materials are also useful in making the mask. For example, any suitable material that changes properties when exposed to light such that the exposed portions and unexposed portions of the material have different properties that are compatible with the disclosed process are useful. In other embodiments, the mask 1038 is printed, for example, by inkjet printing, screen printing, or contact printing.

In the illustrated embodiment, the mask 1038 is used to pattern the layer of patternable material 1036 to form the spacer 1025. Consequently, the mask 1038 has a shape and dimensions substantially matching the shape and dimensions of the desired spacer 1025. For example in some embodiments, the spacer 1025 is configured to extend about a perimeter surrounding the array 1012 of modulators 1010.

In step 930, the patternable material is etched to form the spacer 1025, as illustrated in FIG. 10C. After the mask 1038 is formed, the unmasked portions of the patternable material 1036 are etched. Those skilled in the art will understand that the etching method is selected according to the selected mask material, the selected patternable material, and the other materials used in the device. Suitable etching methods include dry etching and wet etching. In the etching process, patternable material beneath the mask 1038 is shielded from etchant, thereby forming the spacer 1025.

In step 940, the mask 1038 is removed to provide the structure illustrated in FIG. 10D using methods known in the art.

In alternative embodiments, the structure illustrated in FIG. 10D is fabricated without forming a mask 1038 or an etching step. In some of these embodiments, the patternable material 1036 deposited in step 910 comprises a photopatternable material, for example, a photoresist. The photopatternable material 1036 is then exposed and developed as described above to form the spacer 1025 directly.

In some embodiments, the spacer 1025 undergoes additional processing. In some embodiments, an additional layer of a patternable material is deposited and patterned as described above, for example, to fabricate a composite and/or higher spacer 1025. In some embodiments, the spacer 1025 is planarized, for example, by mechanical or chemical-mechanical planarization.

Figure 10E:
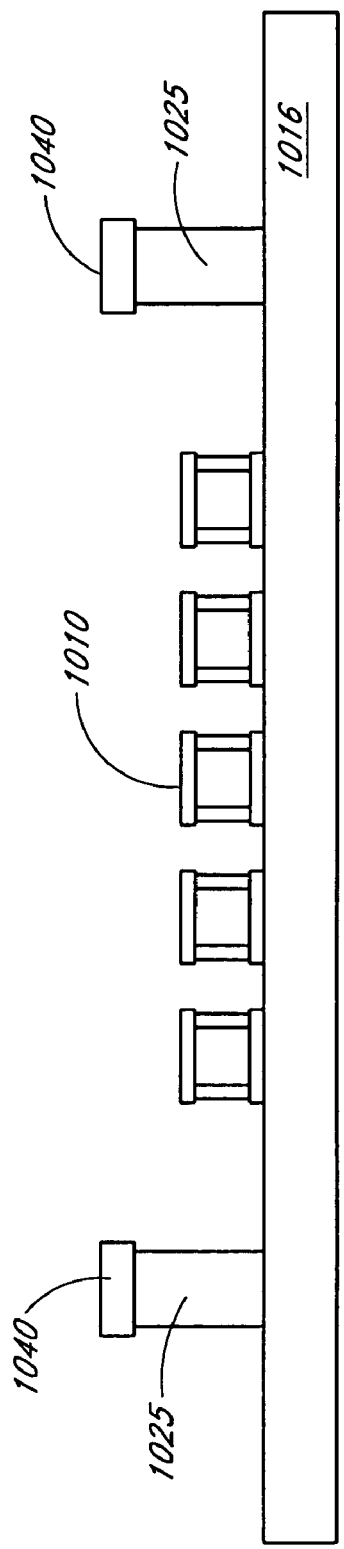

In step 950, an adhesive 1040 is applied to the top 1034 of the spacer, as illustrated in FIG. 10E. Suitable adhesives are discussed above. The adhesive 1040 is applied using any method known in the art, for example, by screen printing, inkjet printing, contact printing, or as an adhesive film. In other embodiments, the adhesive 1040 is applied to the backplate 1028 by any suitable method, for example, by screen printing, inkjet printing, contact printing, or as an adhesive film. Those skilled in the art will appreciate that other methods are useful for applying the adhesive 1040. As discussed above, some embodiments do not use an adhesive. Accordingly, step 950 is optional.

Figure 10F:
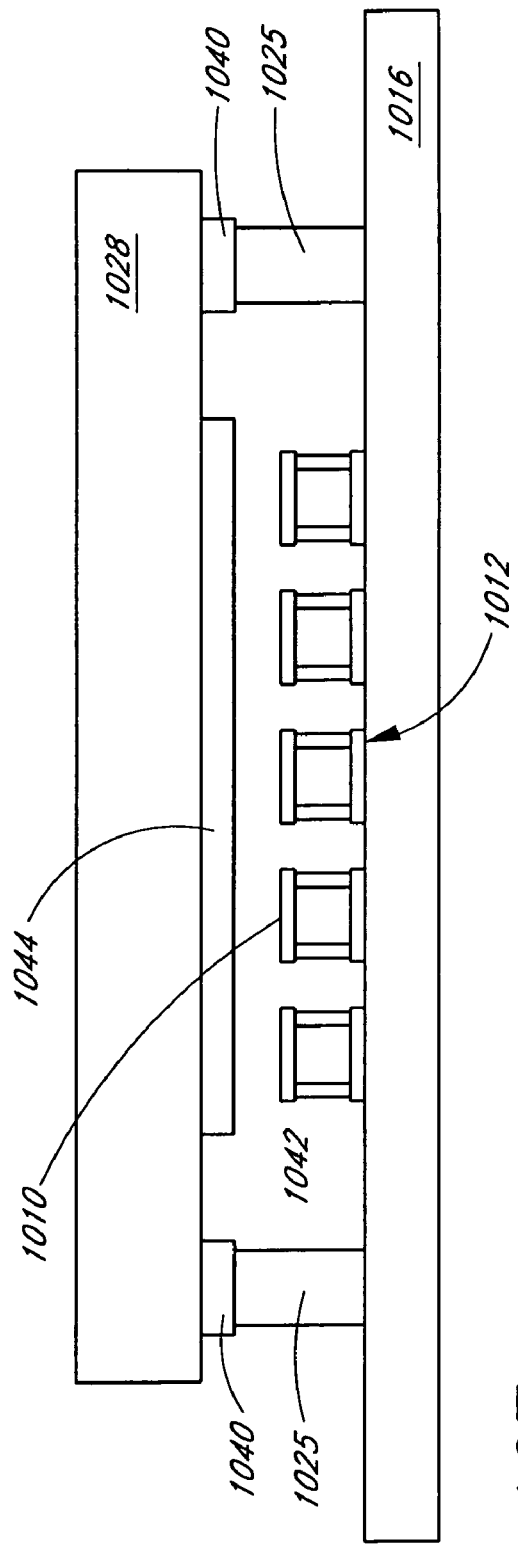

In step 960, the backplate 1028 is secured to the spacer 1025, as illustrated in FIG. 10F. In embodiments in which the spacer 1025 is formed on the backplate, in step 960, the substrate 1016 is sealed to the spacer 1025. In the illustrate embodiment, the backplate 1028 is positioned and contacted with the adhesive 1040. Suitable adhesives are described above. The adhesive 1040 is then cured under conditions suitable for the adhesive, for example, by UV or thermal curing. In embodiments not using an adhesive, the backplate 1028 or substrate 1016 are sealed to the spacer 1025 using another method, for example, by thermal welding.

As illustrated in FIG. 10F, the backplate 1028 and substrate 1016 form a cavity 1042 in the package structure 1000 in which the array 1012 is disposed. In the illustrated embodiment, the spacer 1025 establishes the distance between the backplate 1028 and the substrate 1016, and consequently, the height of the cavity 1042. The height of this cavity 1042 is selected to permit the unimpaired operation of the modulators 1010.

In the embodiment illustrated in FIG. 10F, the backplate 1028 further comprises a desiccant 1044 secured thereto. Suitable desiccants are discussed above. In some embodiments, the desiccant is secured to the backplate 1028, for example, using an adhesive and/or mechanically, prior to securing the backplate 1028 to the spacer 1025. Accordingly, the desiccant 1044 is sealed within the cavity 1042 of the package structure.

In the illustrated embodiment, the desiccant 1044 is in the form of a sheet adhered to the backplate 1028 between the modulators 1010 and the backplate 1028. In other embodiments, the desiccant 1044 has another shape and/or is disposed in a different location in the cavity 1042. For example, in some embodiments, a desiccant 1044 is disposed in another location, for example, between the spacer 1025 and array 1012. In some embodiments, the desiccant 1044 is provided a plurality of packages within the cavity 1042, for example, in bags or capsules. In the illustrated embodiment, height of spacer 1025 is adjusted to take into account the dimensions of the desiccant in order to provide sufficient clearance for the operation of the modulators 1010.

In an embodiment similar to the embodiment described above, the spacer 1025 is formed on the backplate 1028 rather than on the substrate 1016. Accordingly, in step 910, a layer of patternable material 1036 is deposited on a backplate 1028. In step 920, a mask 1038 is formed on the layer of patternable material 1036. In step 930, the patternable material is etched to form the spacer 1025. In step 940, the mask is removed. In step 950, an adhesive 1040 is applied to the spacer 1025. In step 960, a substrate 1016 on which an array of modulators 1010 is supported is secured to the spacer 1025. As discussed above, in some embodiments, the spacer 1025 comprises a photopatternable material, for example, a photoresist, and consequently, separate masking and etching steps are not required.

EXAMPLE 1

Oxide Spacers

In this example, the spacer is silicon dioxide. An interferometric array was fabricated as described in U.S. Published Application 2004/0051929 through the step just prior to the sacrificial or release etch. A layer of silicon dioxide was deposited over the partially fabricated array. In different experiments, the silicon dioxide layer was from 5000 Å to 5 µm thick. Thicker layers were used in some experiments. The spacer was formed from the silicon dioxide layer by conventional masking using a photoresist, and etching. A release etch was then performed as described in U.S. Published Application 2004/0051929. An epoxy adhesive was applied to the contact area on the backplate and the backplate adhered to the spacer. Both planar and recessed backplates were used.

Similar procedures were used in forming silicon dioxide spacer on either planar or recessed backplates, then adhering the backplates to the interferometric modulator arrays.

EXAMPLE 2

Organic Spacers

Similar procedures were followed for fabricating organic spacers on substrates. The spacers were SU-8 photoresist (Microchem Corp), 5000 Å to 10 µm thick. The photoresist was spin-coated onto the substrate prior to the sacrificial etch step, then exposed and developed. The sacrificial release etch was then performed. An epoxy adhesive was applied to the backplate, and the package assembled. Both planar and recessed backplates were used.

Similar procedures were used in forming organic spacers on the backplates, then adhering the backplates to the interferometric modulator arrays.

Those skilled in the art will understand that changes in the manufacturing process described above are possible, for example, adding and/or removing steps, or changing their orders. Moreover, the methods, structures, and systems described herein are useful for packaging other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A display device, comprising:
   a substrate on which an array of interferometric optical modulators is formed;
   a recessed non-transparent backplater; and
   a patterned spacer disposed between the substrate and the backplate to form a package, wherein the spacer circumscribes the array and prevents the external environment from entering the package.

2. The display device of claim 1, wherein the patterned spacer is formed on thebackplate.

3. The display device of claim 1, wherein the patterned spacer comprises a photoresist.

4. The display device of claim 3, wherein the photoresist is an epoxy-based photoresist.

5. The display device of claim 1, wherein the substrate comprises a transparent portion, and an image formed on the array of interferometric optical modulators is viewable through the substrate.

6. The display device of claim 5, wherein the substrate comprises glass.

7. The display device of claim 1, wherein the display device further comprises a desiccant inside the package.

8. The display device of claim 7, wherein the desiccant is calcium oxide.

9. The display device of claim 1, wherein the display device further comprises an adhesive disposed between the spacer and the substrate.

10. A method for fabricating a display device comprising:
    obtaining a substrate on which an array of interferometric optical modulators is formed;
    obtaining a recessed non-transparent backplate;
    forming a spacer by patterning, wherein said spacer is configured to circumscribe the array and prevent the external environment from contacting the array; and
    assembling the substrate, backplate, and spacer to provide the display device.

11. The method of claim 10, wherein the patterned spacer is formed on the backplate.

12. The method of claim 10, wherein the patterned spacer comprises a photoresist.

13. The method of claim 10, wherein the patterned spacer is formed using a mask.

14. The method of claim 10, wherein the substrate comprises a transparent portion, and an image formed on the array of interferometric optical modulators is viewable through the substrate.

15. The method of claim 10, wherein the substrate comprises glass.

16. The method of claim 10, wherein the display device further comprises an adhesive disposed between the spacer and the substrate.

17. A display device fabricated by a method comprising:
    obtaining a substrate on which an array of interferometric modulators is formed;
    obtaining a recessed non-transparent backplate;
    forming a spacer by patterning, wherein said spacer is configured to circumscribe the array and prevent the external environment from contacting the array; and
    assembling the substrate, backplate, and spacer to provide the display device.

18. The display device of claim 17, wherein the patterned spacer is formed on the backplate.

19. The display device of claim 17, wherein the patterned spacer comprises a photoresist.

20. The display device of claim 17, wherein the patterned spacer is formed using a mask.

21. The display device of claim 17, wherein the substrate comprises a transparent portion, and an image formed on the array of interferometric optical modulators is viewable through the substrate.

22. The display device of claim 17, wherein the substrate comprises glass.

23. The display device of claim 17, wherein the display device further comprises an adhesive, disposed between the spacer and the substrate.

* * * * *

UNITED STATES PATENT AND TRADEMARK OFFICE
CERTIFICATE OF CORRECTION

| | | |
|---|---|---|
| PATENT NO. | : 7,701,631 B2 | Page 1 of 1 |
| APPLICATION NO. | : 11/074253 | |
| DATED | : April 20, 2010 | |
| INVENTOR(S) | : Floyd et al. | |

It is certified that error appears in the above-identified patent and that said Letters Patent is hereby corrected as shown below:

On page 3, at column 1, line 64, under U.S. Patent Documents, after "Coleman, Jr.", please insert therefore, --, deceased--.

On page 4, at column 2, line 71, under Other Publications, please remove "Dispaly" and insert therefore, --Display--.

At column 6, line 28, please remove "(1,2 )" and insert therefore, --(1,2)--. Please consider space.

At column 16, line 7, in Claim 1, please remove "backplater;" and insert therefore, --backplate;--.

At column 16, line 13, in Claim 2, please remove "thebackplate." and insert therefore, --the backplate.--.

At column 18, line 4, in Claim 23, please remove "adhesive," and insert therefore, --adhesive--.

Signed and Sealed this

Ninth Day of November, 2010

David J. Kappos
*Director of the United States Patent and Trademark Office*